(12) United States Patent
Kori et al.

(10) Patent No.: US 7,465,666 B2
(45) Date of Patent: Dec. 16, 2008

(54) METHOD FOR FORMING TUNGSTEN MATERIALS DURING VAPOR DEPOSITION PROCESSES

(75) Inventors: Moris Kori, Palo Alto, CA (US); Alfred W. Mak, Union City, CA (US); Jeong Soo Byun, Cupertino, CA (US); Lawrence Chung-Lai Lei, Milpitas, CA (US); Hua Chung, San Jose, CA (US); Ashok Sinha, Palo Alto, CA (US); Ming Xi, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/766,121

(22) Filed: Jun. 21, 2007

(65) Prior Publication Data
US 2007/0254481 A1 Nov. 1, 2007

Related U.S. Application Data

(60) Continuation of application No. 11/468,156, filed on Aug. 29, 2006, now Pat. No. 7,235,486, which is a continuation of application No. 11/338,565, filed on Jan. 24, 2006, now Pat. No. 7,115,494, which is a continuation of application No. 10/951,354, filed on Sep. 29, 2004, now Pat. No. 7,033,922, which is a continuation of application No. 09/625,336, filed on Jul. 25, 2000, now Pat. No. 6,855,368, which is a division of application No. 09/605,593, filed on Jun. 28, 2000, now Pat. No. 6,551,929.

(51) Int. Cl.
*H01L 21/44* (2006.01)

(52) U.S. Cl. .............................. 438/685; 257/E21.168; 257/E21.171

(58) Field of Classification Search .................. 438/68, 438/257, E21.168
See application file for complete search history.

(56) References Cited

U.S. PATENT DOCUMENTS 4,058,430 A 11/1977 Suntola et al.
(Continued)

FOREIGN PATENT DOCUMENTS

DE 198 20 147 7/1999
(Continued)

OTHER PUBLICATIONS

Ashtiani, et al. "Pulsed Nucleation Layer of Tungsten Nitride Barrier Film and its Application in DRAM and Logic Manufacturing," SEMI Technical Symposium: Innovations in Semiconductor Manufacturing (STS: ISM), SEMICON Korea 2006, Semiconductor Equipment and Materials International, pp. 1-6.
(Continued)

*Primary Examiner*—David A Zarneke
(74) *Attorney, Agent, or Firm*—Patterson & Sheridan, LLP

(57) ABSTRACT

In one embodiment, a method for forming a tungsten material on a substrate surface is provide which includes positioning a substrate within a deposition chamber, heating the substrate to a deposition temperature, and exposing the substrate sequentially to diborane and a tungsten precursor gas to form a tungsten nucleation layer on the substrate during an atomic layer deposition (ALD) process. The method further provides exposing the substrate to a deposition gas comprising hydrogen gas and the tungsten precursor gas to form a tungsten bulk layer over the tungsten nucleation layer during a chemical vapor deposition (CVD) process. Examples are provided which include ALD and CVD processes that may be conducted in the same deposition chamber or in different deposition chambers.

33 Claims, 10 Drawing Sheets

U.S. PATENT DOCUMENTS

| | | | |
|---|---|---|---|
| 4,389,973 A | 6/1983 | Suntola et al. |
| 4,413,022 A | 11/1983 | Suntola et al. |
| 4,486,487 A | 12/1984 | Skarp |
| 4,767,494 A | 8/1988 | Kobayashi et al. |
| 4,806,321 A | 2/1989 | Nishizawa et al. |
| 4,813,846 A | 3/1989 | Helms |
| 4,829,022 A | 5/1989 | Kobayashi et al. |
| 4,834,831 A | 5/1989 | Nishizawa et al. |
| 4,838,983 A | 6/1989 | Schumaker et al. |
| 4,838,993 A | 6/1989 | Aoki et al. |
| 4,840,921 A | 6/1989 | Matsumoto |
| 4,845,049 A | 7/1989 | Sunakawa |
| 4,859,625 A | 8/1989 | Matsumoto |
| 4,859,627 A | 8/1989 | Sunakawa |
| 4,861,417 A | 8/1989 | Mochizuki et al. |
| 4,876,218 A | 10/1989 | Pessa et al. |
| 4,917,556 A | 4/1990 | Stark et al. |
| 4,927,670 A | 5/1990 | Erbil |
| 4,931,132 A | 6/1990 | Aspnes et al. |
| 4,951,601 A | 8/1990 | Maydan et al. |
| 4,960,720 A | 10/1990 | Shimbo |
| 4,975,252 A | 12/1990 | Nishizawa et al. |
| 4,993,357 A | 2/1991 | Scholz |
| 5,000,113 A | 3/1991 | Wang et al. |
| 5,013,683 A | 5/1991 | Petroff et al. |
| 5,028,565 A | 7/1991 | Chang et al. |
| 5,082,798 A | 1/1992 | Arimoto |
| 5,085,885 A | 2/1992 | Foley et al. |
| 5,091,320 A | 2/1992 | Aspnes et al. |
| 5,130,269 A | 7/1992 | Kitahara et al. |
| 5,166,092 A | 11/1992 | Mochizuki et al. |
| 5,173,474 A | 12/1992 | Connell et al. |
| 5,186,718 A | 2/1993 | Tepman et al. |
| 5,205,077 A | 4/1993 | Wittstock |
| 5,225,366 A | 7/1993 | Yoder |
| 5,234,561 A | 8/1993 | Randhawa et al. |
| 5,246,536 A | 9/1993 | Nishizawa et al. |
| 5,250,148 A | 10/1993 | Nishizawa et al. |
| 5,254,207 A | 10/1993 | Nishizawa et al. |
| 5,256,244 A | 10/1993 | Ackerman |
| 5,259,881 A | 11/1993 | Edwards et al. |
| 5,270,247 A | 12/1993 | Sakuma et al. |
| 5,278,435 A | 1/1994 | Van Hove et al. |
| 5,281,274 A | 1/1994 | Yoder |
| 5,286,296 A | 2/1994 | Sato et al. |
| 5,290,748 A | 3/1994 | Knuuttila et al. |
| 5,294,286 A | 3/1994 | Nishizawa et al. |
| 5,296,403 A | 3/1994 | Nishizawa et al. |
| 5,300,186 A | 4/1994 | Kitahara et al. |
| 5,306,666 A | 4/1994 | Izumi |
| 5,311,055 A | 5/1994 | Goodman et al. |
| 5,316,615 A | 5/1994 | Copel |
| 5,316,793 A | 5/1994 | Wallace et al. |
| 5,330,610 A | 7/1994 | Eres et al. |
| 5,336,324 A | 8/1994 | Stall et al. |
| 5,338,389 A | 8/1994 | Nishizawa et al. |
| 5,348,911 A | 9/1994 | Jurgensen et al. |
| 5,374,570 A | 12/1994 | Nasu et al. |
| 5,395,791 A | 3/1995 | Cheng et al. |
| 5,438,952 A | 8/1995 | Otsuka |
| 5,439,876 A | 8/1995 | Graf et al. |
| 5,441,703 A | 8/1995 | Jurgensen et al. |
| 5,443,033 A | 8/1995 | Nishizawa et al. |
| 5,443,647 A | 8/1995 | Aucoin et al. |
| 5,455,072 A | 10/1995 | Bension et al. |
| 5,458,084 A | 10/1995 | Thorne et al. |
| 5,469,806 A | 11/1995 | Thorne et al. |
| 5,480,818 A | 1/1996 | Matsumoto et al. |
| 5,483,919 A | 1/1996 | Yokoyama et al. |
| 5,484,664 A | 1/1996 | Kitahara et al. |
| 5,503,875 A | 4/1996 | Imai et al. |
| 5,521,126 A | 5/1996 | Okamura et al. |
| 5,527,733 A | 6/1996 | Nishizawa et al. |
| 5,532,511 A | 7/1996 | Nishizawa et al. |
| 5,540,783 A | 7/1996 | Eres et al. |
| 5,580,380 A | 12/1996 | Liu et al. |
| 5,601,651 A | 2/1997 | Watabe |
| 5,609,689 A | 3/1997 | Kato et al. |
| 5,616,181 A | 4/1997 | Yamamoto et al. |
| 5,637,530 A | 6/1997 | Gaines et al. |
| 5,641,984 A | 6/1997 | Aftergut et al. |
| 5,644,128 A | 7/1997 | Wollnik et al. |
| 5,526,244 A | 8/1997 | Sekine et al. |
| 5,667,592 A | 9/1997 | Boitnott et al. |
| 5,674,786 A | 10/1997 | Turner et al. |
| 5,693,139 A | 12/1997 | Nishizawa et al. |
| 5,695,564 A | 12/1997 | Imahashi |
| 5,705,224 A | 1/1998 | Murota et al. |
| 5,707,880 A | 1/1998 | Aftergut et al. |
| 5,711,811 A | 1/1998 | Suntola et al. |
| 5,730,801 A | 3/1998 | Tepman et al. |
| 5,730,802 A | 3/1998 | Ishizumi et al. |
| 5,747,113 A | 5/1998 | Tsai et al. |
| 5,749,974 A | 5/1998 | Habuka et al. |
| 5,788,447 A | 8/1998 | Yonemitsu et al. |
| 5,788,799 A | 8/1998 | Steger et al. |
| 5,796,116 A | 8/1998 | Nakata et al. |
| 5,801,634 A | 9/1998 | Young et al. |
| 5,804,488 A | 9/1998 | Shih et al. |
| 5,807,792 A | 9/1998 | Ilg et al. |
| 5,830,270 A | 11/1998 | McKee et al. |
| 5,834,372 A | 11/1998 | Lee |
| 5,835,677 A | 11/1998 | Li et al. |
| 5,851,849 A | 12/1998 | Comizzoli et al. |
| 5,855,675 A | 1/1999 | Doering et al. |
| 5,855,680 A | 1/1999 | Soininen et al. |
| 5,856,219 A | 1/1999 | Naito et al. |
| 5,858,102 A | 1/1999 | Tsai |
| 5,866,213 A | 2/1999 | Foster et al. |
| 5,866,795 A | 2/1999 | Wang et al. |
| 5,879,459 A | 3/1999 | Gadgil et al. |
| 5,882,165 A | 3/1999 | Maydan et al. |
| 5,882,413 A | 3/1999 | Beaulieu et al. |
| 5,904,565 A | 5/1999 | Nguyen et al. |
| 5,916,365 A | 6/1999 | Sherman |
| 5,923,056 A | 7/1999 | Lee et al. |
| 5,923,985 A | 7/1999 | Aoki et al. |
| 5,925,574 A | 7/1999 | Aoki et al. |
| 5,928,389 A | 7/1999 | Jevtic |
| 5,942,040 A | 8/1999 | Kim et al. |
| 5,947,710 A | 9/1999 | Cooper et al. |
| 5,972,430 A | 10/1999 | DiMeo, Jr. et al. |
| 6,001,420 A | 12/1999 | Mosely et al. |
| 6,001,669 A | 12/1999 | Gaines et al. |
| 6,015,590 A | 1/2000 | Suntola et al. |
| 6,015,917 A | 1/2000 | Bhandari et al. |
| 6,025,627 A | 2/2000 | Forbes et al. |
| 6,036,773 A | 3/2000 | Wang et al. |
| 6,042,652 A | 3/2000 | Hyun et al. |
| 6,043,177 A | 3/2000 | Falconer et al. |
| 6,051,286 A | 4/2000 | Zhao et al. |
| 6,062,798 A | 5/2000 | Muka |
| 6,071,808 A | 6/2000 | Merchant et al. |
| 6,084,302 A | 7/2000 | Sandhu |
| 6,086,677 A | 7/2000 | Umotoy et al. |
| 6,099,904 A | 8/2000 | Mak et al. |
| 6,110,556 A | 8/2000 | Bang et al. |
| 6,113,977 A | 9/2000 | Soininen et al. |
| 6,117,244 A | 9/2000 | Bang et al. |
| 6,124,158 A | 9/2000 | Dautartas et al. |
| 6,130,147 A | 10/2000 | Major et al. |
| 6,139,700 A | 10/2000 | Kang et al. |
| 6,140,237 A | 10/2000 | Chan et al. |
| 6,140,238 A | 10/2000 | Kitch |

| | | | | | | |
|---|---|---|---|---|---|---|
| 6,143,659 | A | 11/2000 | Leem | 6,632,279 B1 | 10/2003 | Ritala et al. |
| 6,144,060 | A | 11/2000 | Park et al. | 6,635,965 B1 | 10/2003 | Lee et al. |
| 6,156,382 | A | 12/2000 | Rajagopalan et al. | 6,660,126 B2 | 12/2003 | Nguyen et al. |
| 6,158,446 | A | 12/2000 | Mohindra et al. | 6,660,622 B2 | 12/2003 | Chen et al. |
| 6,162,715 | A | 12/2000 | Mak et al. | 6,686,271 B2 | 2/2004 | Raaijmakers et al. |
| 6,174,377 | B1 | 1/2001 | Doering et al. | 6,713,373 B1 | 3/2004 | Omstead |
| 6,174,809 | B1 | 1/2001 | Kang et al. | 6,718,126 B2 | 4/2004 | Lei |
| 6,197,683 | B1 | 3/2001 | Kang et al. | 6,720,027 B2 | 4/2004 | Yang et al. |
| 6,200,893 | B1 | 3/2001 | Sneh | 6,720,260 B1 | 4/2004 | Fair et al. |
| 6,203,613 | B1 | 3/2001 | Gates et al. | 6,740,585 B2 | 5/2004 | Yoon et al. |
| 6,206,967 | B1 | 3/2001 | Mak et al. | 6,764,940 B1 | 7/2004 | Rozbicki et al. |
| 6,207,302 | B1 | 3/2001 | Sugiura et al. | 6,772,072 B2 | 8/2004 | Ganguli et al. |
| 6,207,487 | B1 | 3/2001 | Kim et al. | 6,773,507 B2 | 8/2004 | Jallepally et al. |
| 6,218,298 | B1 | 4/2001 | Hoinkis | 6,777,352 B2 | 8/2004 | Tepman et al. |
| 6,248,605 | B1 | 6/2001 | Harkonen et al. | 6,784,096 B2 | 8/2004 | Chen et al. |
| 6,251,190 | B1 | 6/2001 | Mak et al. | 6,790,773 B1 | 9/2004 | Drewery et al. |
| 6,270,572 | B1 | 8/2001 | Kim et al. | 6,797,340 B2 * | 9/2004 | Fang et al. .................. 427/585 |
| 6,271,148 | B1 | 8/2001 | Kao et al. | 6,797,642 B1 | 9/2004 | Chu et al. |
| 6,274,484 | B1 | 8/2001 | Tsai et al. | 6,800,173 B2 | 10/2004 | Chiang et al. |
| 6,284,646 | B1 | 9/2001 | Leem | 6,803,272 B1 | 10/2004 | Halliyal et al. |
| 6,287,965 | B1 | 9/2001 | Kang et al. | 6,809,026 B2 | 10/2004 | Yoon et al. |
| 6,291,876 | B1 | 9/2001 | Stumborg et al. | 6,815,285 B2 | 11/2004 | Choi et al. |
| 6,305,314 | B1 | 10/2001 | Sneh et al. | 6,821,563 B2 | 11/2004 | Yudovsky |
| 6,306,216 | B1 | 10/2001 | Kim et al. | 6,821,889 B2 | 11/2004 | Elers et al. |
| 6,309,713 | B1 | 10/2001 | Mak et al. | 6,827,978 B2 | 12/2004 | Yoon et al. |
| 6,306,098 | B1 | 11/2001 | Yitzchail et al. | 6,831,004 B2 | 12/2004 | Byun et al. |
| 6,326,297 | B1 | 12/2001 | Vijayendran | 6,833,161 B2 | 12/2004 | Wang et al. |
| 6,333,260 | B1 | 12/2001 | Kwon et al. | 6,838,125 B2 | 1/2005 | Chung et al. |
| 6,335,280 | B1 | 1/2002 | van der Jeugd | 6,846,516 B2 | 1/2005 | Yang et al. |
| 6,342,277 | B1 | 1/2002 | Sherman | 6,849,545 B2 | 2/2005 | Mak et al. |
| 6,348,376 | B2 | 2/2002 | Lim et al. | 6,855,368 B1 | 2/2005 | Kori et al. |
| 6,355,561 | B1 | 3/2002 | Sandhu et al. | 6,875,271 B2 | 4/2005 | Glenn et al. |
| 6,358,829 | B2 | 3/2002 | Yoon et al. | 6,878,402 B2 | 4/2005 | Chiang et al. |
| 6,368,954 | B1 | 4/2002 | Lopatin et al. | 6,893,915 B2 | 5/2005 | Park et al. |
| 6,369,430 | B1 | 4/2002 | Adetutu et al. | 6,905,541 B2 | 6/2005 | Chen et al. |
| 6,372,598 | B2 | 4/2002 | Kang et al. | 6,905,737 B2 | 6/2005 | Verplancken et al. |
| 6,379,748 | B1 | 4/2002 | Bhandari et al. | 6,911,391 B2 | 6/2005 | Yang et al. |
| 6,391,785 | B1 | 5/2002 | Satta et al. | 6,915,592 B2 | 7/2005 | Guenther |
| 6,399,491 | B2 | 6/2002 | Jeon et al. | 6,916,398 B2 | 7/2005 | Chen et al. |
| 6,416,577 | B1 | 7/2002 | Suntola et al. | 6,932,871 B2 | 8/2005 | Chang et al. |
| 6,416,822 | B1 | 7/2002 | Chiang et al. | 6,936,538 B2 | 8/2005 | Byun |
| 6,420,189 | B1 | 7/2002 | Lopatin | 6,936,906 B2 | 8/2005 | Chung et al. |
| 6,423,619 | B1 | 7/2002 | Grant et al. | 6,939,801 B2 | 9/2005 | Chung et al. |
| 6,428,859 | B1 | 8/2002 | Chiang et al. | 6,939,804 B2 | 9/2005 | Lai et al. |
| 6,447,933 | B1 | 9/2002 | Wang et al. | 6,951,804 B2 | 10/2005 | Seutter et al. |
| 6,451,119 | B2 | 9/2002 | Sneh et al. | 6,953,742 B2 | 10/2005 | Chen et al. |
| 6,451,695 | B2 | 9/2002 | Sneh | 6,955,211 B2 | 10/2005 | Ku et al. |
| 6,458,701 | B1 | 10/2002 | Chae et al. | 6,958,174 B1 | 10/2005 | Klaus et al. |
| 6,468,924 | B2 | 10/2002 | Lee et al. | 6,958,296 B2 | 10/2005 | Chen et al. |
| 6,475,276 | B1 | 11/2002 | Elers et al. | 6,972,267 B2 | 12/2005 | Cao et al. |
| 6,475,910 | B1 | 11/2002 | Sneh | 6,974,771 B2 | 12/2005 | Chen et al. |
| 6,478,872 | B1 | 11/2002 | Chae et al. | 6,998,014 B2 | 2/2006 | Chen et al. |
| 6,482,262 | B1 | 11/2002 | Elers et al. | 7,005,372 B2 | 2/2006 | Levy et al. |
| 6,482,733 | B2 | 11/2002 | Raaijmakers et al. | 7,026,238 B2 | 4/2006 | Xi et al. |
| 6,482,740 | B2 | 11/2002 | Soininen et al. | 7,033,922 B2 | 4/2006 | Kori et al. |
| 6,498,091 | B1 | 12/2002 | Chen et al. | 7,041,335 B2 | 5/2006 | Chung |
| 6,511,539 | B1 | 1/2003 | Raaijmakers | 7,049,226 B2 | 5/2006 | Chung et al. |
| 6,524,952 | B1 | 2/2003 | Srinivas et al. | 7,081,271 B2 | 7/2006 | Chung et al. |
| 6,534,395 | B2 | 3/2003 | Werkhoven et al. | 7,094,680 B2 | 8/2006 | Seutter et al. |
| 6,534,404 | B1 | 3/2003 | Danek et al. | 7,094,685 B2 | 8/2006 | Yang et al. |
| 6,548,424 | B2 | 4/2003 | Putkonen | 7,101,795 B1 | 9/2006 | Xi et al. |
| 6,551,929 | B1 | 4/2003 | Kori et al. | 7,115,494 B2 | 10/2006 | Sinha et al. |
| 6,569,501 | B2 | 5/2003 | Chiang et al. | 7,115,499 B2 | 10/2006 | Wang et al. |
| 6,585,823 | B1 | 7/2003 | Van Wijck | 7,141,494 B2 | 11/2006 | Lee et al. |
| 6,593,484 | B2 | 7/2003 | Yasuhara et al. | 7,186,385 B2 | 3/2007 | Ganguli et al. |
| 6,596,602 | B2 | 7/2003 | Iizuka et al. | 7,204,886 B2 | 4/2007 | Chen et al. |
| 6,596,643 | B2 | 7/2003 | Chen et al. | 7,208,413 B2 | 4/2007 | Byun et al. |
| 6,599,572 | B2 | 7/2003 | Saanila et al. | 7,211,144 B2 | 5/2007 | Lu et al. |
| 6,607,976 | B2 | 8/2003 | Chen et al. | 7,211,508 B2 | 5/2007 | Chung et al. |
| 6,607,977 | B1 | 8/2003 | Rozbicki et al. | 7,220,673 B2 | 5/2007 | Xi et al. |
| 6,620,723 | B1 | 9/2003 | Byun et al. | 7,235,486 B2 | 6/2007 | Kori et al. |
| 6,627,268 | B1 | 9/2003 | Fair et al. | 2001/0000866 A1 | 5/2001 | Sneh et al. |
| 6,630,201 | B2 | 10/2003 | Chiang et al. | 2001/0002280 A1 | 5/2001 | Sneh |

| | | | | | |
|---|---|---|---|---|---|
| 2001/0009140 A1 | 7/2001 | Bondestam et al. | 2003/0029715 A1 | 2/2003 | Yu et al. |
| 2001/0009695 A1 | 7/2001 | Saanila et al. | 2003/0031807 A1 | 2/2003 | Elers et al. |
| 2001/0011526 A1 | 8/2001 | Doering et al. | 2003/0032281 A1 | 2/2003 | Werkhoven et al. |
| 2001/0024387 A1 | 9/2001 | Raaijmakers et al. | 2003/0038369 A1 | 2/2003 | Layadi et al. |
| 2001/0025979 A1 | 10/2001 | Kim et al. | 2003/0042630 A1 | 3/2003 | Babcoke et al. |
| 2001/0028924 A1 | 10/2001 | Sherman | 2003/0049931 A1 | 3/2003 | Byun et al. |
| 2001/0029094 A1 | 10/2001 | Mee-Young et al. | 2003/0049942 A1 | 3/2003 | Haukka et al. |
| 2001/0031562 A1 | 10/2001 | Raaijmakers et al. | 2003/0053799 A1 | 3/2003 | Lei |
| 2001/0034123 A1 | 10/2001 | Jeon et al. | 2003/0054631 A1 | 3/2003 | Raaijmakers et al. |
| 2001/0041250 A1 | 11/2001 | Werkhoven | 2003/0057526 A1 | 3/2003 | Chung et al. |
| 2001/0042799 A1 | 11/2001 | Kim et al. | 2003/0057527 A1 | 3/2003 | Chung et al. |
| 2001/0050039 A1 | 12/2001 | Park | 2003/0059538 A1 | 3/2003 | Chung et al. |
| 2001/0054730 A1 | 12/2001 | Kim et al. | 2003/0072884 A1 | 4/2003 | Zhang et al. |
| 2001/0054769 A1 | 12/2001 | Raaijmakers et al. | 2003/0072975 A1 | 4/2003 | Shero et al. |
| 2002/0000598 A1 | 1/2002 | Kang et al. | 2003/0079686 A1 | 5/2003 | Chen et al. |
| 2002/0004293 A1 | 1/2002 | Soininen et al. | 2003/0082296 A1 | 5/2003 | Elers et al. |
| 2002/0007790 A1 | 1/2002 | Park | 2003/0082300 A1 | 5/2003 | Todd et al. |
| 2002/0009544 A1 | 1/2002 | McFeely et al. | 2003/0082301 A1 | 5/2003 | Chen et al. |
| 2002/0019121 A1 | 2/2002 | Pyo | 2003/0082307 A1 | 5/2003 | Chung et al. |
| 2002/0020869 A1 | 2/2002 | Park et al. | 2003/0087520 A1 | 5/2003 | Chen et al. |
| 2002/0021544 A1 | 2/2002 | Cho et al. | 2003/0089308 A1 | 5/2003 | Raaijmakers |
| 2002/0031618 A1 | 3/2002 | Sherman | 2003/0101927 A1 | 6/2003 | Raaijmakers et al. |
| 2002/0037630 A1 | 3/2002 | Agarwal et al. | 2003/0104126 A1 | 6/2003 | Fang et al. |
| 2002/0041931 A1 | 4/2002 | Suntola et al. | 2003/0106490 A1 | 6/2003 | Jallepally et al. |
| 2002/0048635 A1 | 4/2002 | Kim et al. | 2003/0108674 A1 | 6/2003 | Chung et al. |
| 2002/0048880 A1 | 4/2002 | Lee | 2003/0113187 A1 | 6/2003 | Lei et al. |
| 2002/0052097 A1 | 5/2002 | Park | 2003/0116087 A1 | 6/2003 | Nguyen et al. |
| 2002/0055235 A1 | 5/2002 | Agarwal et al. | 2003/0121608 A1 | 7/2003 | Chen et al. |
| 2002/0060363 A1 | 5/2002 | Xi et al. | 2003/0123216 A1 | 7/2003 | Yoon et al. |
| 2002/0061612 A1 | 5/2002 | Sandhu et al. | 2003/0124262 A1 | 7/2003 | Chen et al. |
| 2002/0066411 A1 | 6/2002 | Chiang et al. | 2003/0127043 A1 | 7/2003 | Lu et al. |
| 2002/0068458 A1 | 6/2002 | Chiang et al. | 2003/0129826 A1 | 7/2003 | Werkhoven et al. |
| 2002/0073924 A1 | 6/2002 | Chiang et al. | 2003/0134508 A1 | 7/2003 | Raaijmakers et al. |
| 2002/0074588 A1 | 6/2002 | Lee et al. | 2003/0143328 A1 | 7/2003 | Chen et al. |
| 2002/0076481 A1 | 6/2002 | Chiang et al. | 2003/0143839 A1 | 7/2003 | Raaijmakers et al. |
| 2002/0076507 A1 | 6/2002 | Chiang et al. | 2003/0143841 A1 | 7/2003 | Yang et al. |
| 2002/0076508 A1 | 6/2002 | Chiang et al. | 2003/0153177 A1 | 8/2003 | Tepman |
| 2002/0076837 A1 | 6/2002 | Hujanen et al. | 2003/0153181 A1 | 8/2003 | Yoon et al. |
| 2002/0081844 A1 | 6/2002 | Jeon et al. | 2003/0157760 A1 | 8/2003 | Xi et al. |
| 2002/0086111 A1 | 7/2002 | Byun et al. | 2003/0161952 A1 | 8/2003 | Wang et al. |
| 2002/0086507 A1 | 7/2002 | Park et al. | 2003/0165615 A1 | 9/2003 | Aaltonen et al. |
| 2002/0090829 A1 | 7/2002 | Sandhu et al. | 2003/0168750 A1 | 9/2003 | Basceri et al. |
| 2002/0094689 A1 | 7/2002 | Park | 2003/0173586 A1 | 9/2003 | Moriwaki et al. |
| 2002/0098627 A1 | 7/2002 | Pomarede et al. | 2003/0181035 A1 | 9/2003 | Yoon |
| 2002/0104481 A1 | 8/2002 | Chiang et al. | 2003/0186495 A1 | 10/2003 | Saanila et al. |
| 2002/0105088 A1 | 8/2002 | Yang et al. | 2003/0190423 A1 | 10/2003 | Yang et al. |
| 2002/0106536 A1 | 8/2002 | Lee et al. | 2003/0190497 A1 | 10/2003 | Yang et al. |
| 2002/0106846 A1 | 8/2002 | Seutter et al. | 2003/0190804 A1 | 10/2003 | Glenn et al. |
| 2002/0109168 A1 | 8/2002 | Kim et al. | 2003/0194493 A1 | 10/2003 | Chang et al. |
| 2002/0115886 A1 | 8/2002 | Yasuhara et al. | 2003/0194825 A1 | 10/2003 | Law et al. |
| 2002/0117399 A1 | 8/2002 | Chen et al. | 2003/0194858 A1 | 10/2003 | Lee et al. |
| 2002/0121241 A1 | 9/2002 | Nguyen et al. | 2003/0203616 A1 | 10/2003 | Chung et al. |
| 2002/0121342 A1 | 9/2002 | Nguyen et al. | 2003/0205729 A1 | 11/2003 | Basceri et al. |
| 2002/0121697 A1 | 9/2002 | Marsh | 2003/0213987 A1 | 11/2003 | Basceri et al. |
| 2002/0135071 A1 | 9/2002 | Kang et al. | 2003/0219942 A1 | 11/2003 | Choi et al. |
| 2002/0144655 A1 | 10/2002 | Chiang et al. | 2003/0224217 A1 | 12/2003 | Byun et al. |
| 2002/0144657 A1 | 10/2002 | Chiang et al. | 2003/0224578 A1 | 12/2003 | Chung et al. |
| 2002/0146511 A1 | 10/2002 | Chiang et al. | 2003/0224600 A1 | 12/2003 | Cao et al. |
| 2002/0155722 A1 | 10/2002 | Satta et al. | 2003/0232497 A1 | 12/2003 | Xi et al. |
| 2002/0162506 A1 | 11/2002 | Sneh et al. | 2004/0005749 A1 | 1/2004 | Choi et al. |
| 2002/0164421 A1 | 11/2002 | Chiang et al. | 2004/0009307 A1 | 1/2004 | Koh et al. |
| 2002/0164423 A1 | 11/2002 | Chiang et al. | 2004/0009336 A1 | 1/2004 | Marcadal et al. |
| 2002/0177282 A1 | 11/2002 | Song et al. | 2004/0011504 A1 | 1/2004 | Ku et al. |
| 2002/0182320 A1 | 12/2002 | Leskela et al. | 2004/0013577 A1 | 1/2004 | Ganguli et al. |
| 2002/0187256 A1 | 12/2002 | Elers et al. | 2004/0013803 A1 | 1/2004 | Chung et al. |
| 2002/0187631 A1 | 12/2002 | Kim et al. | 2004/0014315 A1 | 1/2004 | Lai et al. |
| 2002/0197402 A1 | 12/2002 | Chiang et al. | 2004/0014320 A1 | 1/2004 | Chen et al. |
| 2002/0197863 A1 | 12/2002 | Mak et al. | 2004/0015300 A1 | 1/2004 | Ganguli et al. |
| 2003/0013300 A1 | 1/2003 | Byun | 2004/0018304 A1 | 1/2004 | Chung et al. |
| 2003/0013320 A1 | 1/2003 | Kim et al. | 2004/0018723 A1 | 1/2004 | Byun et al. |
| 2003/0017697 A1 | 1/2003 | Choi et al. | 2004/0018747 A1 | 1/2004 | Lee et al. |
| 2003/0022487 A1 | 1/2003 | Yoon et al. | 2004/0025370 A1 | 2/2004 | Guenther |
| 2003/0022507 A1 | 1/2003 | Chen et al. | 2004/0033698 A1 | 2/2004 | Lee et al. |

| | | |
|---|---|---|
| 2004/0041320 A1 | 3/2004 | Hodumi |
| 2004/0043630 A1 | 3/2004 | Vaartstra et al. |
| 2004/0048461 A1 | 3/2004 | Chen et al. |
| 2004/0065255 A1 | 4/2004 | Yang et al. |
| 2004/0067641 A1 | 4/2004 | Yudovsky |
| 2004/0071897 A1 | 4/2004 | Verplancken et al. |
| 2004/0077183 A1 | 4/2004 | Chung et al. |
| 2004/0105934 A1 | 6/2004 | Chang et al. |
| 2004/0144311 A1 | 7/2004 | Chen et al. |
| 2004/0170403 A1 | 9/2004 | Lei |
| 2004/0187304 A1 | 9/2004 | Chen et al. |
| 2004/0197492 A1 | 10/2004 | Chen et al. |
| 2004/0202786 A1 | 10/2004 | Wongsenakhum |
| 2004/0209460 A1 | 10/2004 | Xi et al. |
| 2004/0209465 A1 | 10/2004 | Xi et al. |
| 2004/0211665 A1 | 10/2004 | Yoon et al. |
| 2004/0214354 A1 | 10/2004 | Conley, Jr. et al. |
| 2004/0219784 A1 | 11/2004 | Kang et al. |
| 2004/0224506 A1 | 11/2004 | Choi et al. |
| 2004/0235285 A1 | 11/2004 | Kang et al. |
| 2004/0241321 A1 | 12/2004 | Ganguli et al. |
| 2004/0247788 A1 | 12/2004 | Fang et al. |
| 2004/0256351 A1 | 12/2004 | Chung et al. |
| 2004/0266175 A1 | 12/2004 | Chen et al. |
| 2005/0006799 A1 | 1/2005 | Gregg et al. |
| 2005/0008779 A1 | 1/2005 | Yang et al. |
| 2005/0009325 A1 | 1/2005 | Chung et al. |
| 2005/0031786 A1 | 2/2005 | Lee et al. |
| 2005/0059240 A1 | 3/2005 | Choi et al. |
| 2005/0059241 A1 | 3/2005 | Kori et al. |
| 2005/0064098 A1 | 3/2005 | Elers et al. |
| 2005/0074968 A1 | 4/2005 | Chen et al. |
| 2005/0104142 A1 | 5/2005 | Narayanan et al. |
| 2005/0106865 A1 | 5/2005 | Chung et al. |
| 2005/0118804 A1 | 6/2005 | Byun et al. |
| 2005/0139948 A1 | 6/2005 | Chung et al. |
| 2005/0164487 A1 | 7/2005 | Seutter et al. |
| 2005/0173068 A1 | 8/2005 | Chen et al. |
| 2005/0176240 A1 | 8/2005 | Wang et al. |
| 2005/0189072 A1 | 9/2005 | Chen et al. |
| 2005/0208763 A1 | 9/2005 | Byun et al. |
| 2005/0220998 A1 | 10/2005 | Chang et al. |
| 2005/0252449 A1 | 11/2005 | Nguyen et al. |
| 2005/0255690 A1 | 11/2005 | Chen et al. |
| 2005/0257735 A1 | 11/2005 | Guenther et al. |
| 2005/0260357 A1 | 11/2005 | Olsen et al. |
| 2005/0266682 A1 | 12/2005 | Chen et al. |
| 2005/0271812 A1 | 12/2005 | Myo et al. |
| 2005/0271813 A1 | 12/2005 | Kher et al. |
| 2005/0271814 A1 | 12/2005 | Chang et al. |
| 2005/0277290 A1 | 12/2005 | Yang et al. |
| 2005/0287807 A1 | 12/2005 | Lai et al. |
| 2006/0009034 A1 | 1/2006 | Lai et al. |
| 2006/0019033 A1 | 1/2006 | Muthukrishnan et al. |
| 2006/0019494 A1 | 1/2006 | Cao et al. |
| 2006/0019495 A1 | 1/2006 | Marcadal et al. |
| 2006/0030148 A1 | 2/2006 | Seutter et al. |
| 2006/0035025 A1 | 2/2006 | Verplancken et al. |
| 2006/0040052 A1 | 2/2006 | Feng et al. |
| 2006/0057843 A1 | 3/2006 | Chen et al. |
| 2006/0062917 A1 | 3/2006 | Muthukrishman et al. |
| 2006/0075966 A1 | 4/2006 | Chen et al. |
| 2006/0128132 A1 | 6/2006 | Sinha et al. |
| 2006/0128150 A1 | 6/2006 | Gandikota et al. |
| 2006/0148253 A1 | 7/2006 | Chung et al. |
| 2006/0153973 A1 | 7/2006 | Chang et al. |
| 2006/0153995 A1 | 7/2006 | Narwankar et al. |
| 2006/0156979 A1 | 7/2006 | Thakur et al. |
| 2006/0199372 A1 | 9/2006 | Chung et al. |
| 2006/0216928 A1 | 9/2006 | Chung et al. |
| 2006/0257295 A1 | 11/2006 | Chen et al. |
| 2006/0264031 A1 | 11/2006 | Xi et al. |
| 2006/0276020 A1 | 12/2006 | Yoon et al. |
| 2006/0292864 A1 | 12/2006 | Yang et al. |
| 2006/0292874 A1 | 12/2006 | Kori et al. |
| 2007/0003698 A1 | 1/2007 | Chen et al. |
| 2007/0009658 A1 | 1/2007 | Yoo et al. |
| 2007/0018244 A1 | 1/2007 | Hung et al. |
| 2007/0020890 A1 | 1/2007 | Thakur et al. |
| 2007/0020924 A1 | 1/2007 | Wang et al. |
| 2007/0026147 A1 | 2/2007 | Chen et al. |
| 2007/0067609 A1 | 3/2007 | Chen et al. |
| 2007/0099415 A1 | 5/2007 | Chen et al. |
| 2007/0119370 A1 | 5/2007 | Ma et al. |
| 2007/0119371 A1 | 5/2007 | Ma et al. |
| 2007/0128862 A1 | 6/2007 | Ma et al. |
| 2007/0128863 A1 | 6/2007 | Ma et al. |
| 2007/0128864 A1 | 6/2007 | Ma et al. |

FOREIGN PATENT DOCUMENTS

| | | |
|---|---|---|
| DE | 196 27 017 | 1/2000 |
| EP | 0 344 352 | 12/1989 |
| EP | 0 429 270 | 5/1991 |
| EP | 0 442 490 | 8/1991 |
| EP | 0 799 641 | 10/1997 |
| EP | 1 167 569 | 1/2002 |
| FR | 2 626 110 | 7/1989 |
| FR | 2 692 597 | 12/1993 |
| GB | 2 355 727 | 5/2001 |
| JP | 58-098917 | 6/1983 |
| JP | 58-100419 | 6/1983 |
| JP | 60-065712 | 4/1985 |
| JP | 61-035847 | 2/1986 |
| JP | 61-210623 | 9/1986 |
| JP | 61-069508 | 3/1987 |
| JP | 62-091495 | 4/1987 |
| JP | 62-141717 | 6/1987 |
| JP | 62-167297 | 7/1987 |
| JP | 62-171999 | 7/1987 |
| JP | 62-232919 | 10/1987 |
| JP | 63-062313 | 3/1988 |
| JP | 63-085098 | 4/1988 |
| JP | 63-090833 | 4/1988 |
| JP | 63-222420 | 9/1988 |
| JP | 63-222421 | 9/1988 |
| JP | 63-227007 | 9/1988 |
| JP | 63-252420 | 10/1988 |
| JP | 63-266814 | 11/1988 |
| JP | 64-009895 | 1/1989 |
| JP | 64-009896 | 1/1989 |
| JP | 64-009897 | 1/1989 |
| JP | 64-037832 | 2/1989 |
| JP | 64-082615 | 3/1989 |
| JP | 64-082617 | 3/1989 |
| JP | 64-082671 | 3/1989 |
| JP | 64-082676 | 3/1989 |
| JP | 01-103982 | 4/1989 |
| JP | 01-103996 | 4/1989 |
| JP | 64-090524 | 4/1989 |
| JP | 01-117017 | 5/1989 |
| JP | 01-143221 | 6/1989 |
| JP | 01-143233 | 6/1989 |
| JP | 01-154511 | 6/1989 |
| JP | 01-236657 | 9/1989 |
| JP | 01-245512 | 9/1989 |
| JP | 01-264218 | 10/1989 |
| JP | 01-270593 | 10/1989 |
| JP | 01-272108 | 10/1989 |
| JP | 01-290221 | 11/1989 |
| JP | 01-290222 | 11/1989 |
| JP | 01-296673 | 11/1989 |
| JP | 01-303770 | 12/1989 |
| JP | 01-305894 | 12/1989 |
| JP | 01-313927 | 12/1989 |
| JP | 02-012814 | 1/1990 |

| | | | | | |
|---|---|---|---|---|---|
| JP | 02-014513 | 1/1990 | JP | 06-224138 | 8/1994 |
| JP | 02-017634 | 1/1990 | JP | 06-230421 | 8/1994 |
| JP | 02-063115 | 3/1990 | JP | 06-252057 | 9/1994 |
| JP | 02-074029 | 3/1990 | JP | 06-291048 | 10/1994 |
| JP | 02-074587 | 3/1990 | JP | 07-070752 | 3/1995 |
| JP | 02-106822 | 4/1990 | JP | 07-086269 | 3/1995 |
| JP | 02-129913 | 5/1990 | JP | 07-300649 | 11/1995 |
| JP | 02-162717 | 6/1990 | JP | 08-181076 | 7/1996 |
| JP | 02-172895 | 7/1990 | JP | 08-245291 | 9/1996 |
| JP | 02-196092 | 8/1990 | JP | 08-264530 | 10/1996 |
| JP | 02-203517 | 8/1990 | JP | 09-260786 | 10/1997 |
| JP | 02-230690 | 9/1990 | JP | 09-293681 | 11/1997 |
| JP | 02-230722 | 9/1990 | JP | 10-188840 | 7/1998 |
| JP | 02-246161 | 9/1990 | JP | 10-190128 | 7/1998 |
| JP | 02-264491 | 10/1990 | JP | 10-308283 | 11/1998 |
| JP | 02-283084 | 11/1990 | JP | 11-269652 | 10/1999 |
| JP | 02-304916 | 12/1990 | JP | 2000-031387 | 1/2000 |
| JP | 03-019211 | 1/1991 | JP | 2000-058777 | 2/2000 |
| JP | 03-022569 | 1/1991 | JP | 2000-068072 | 3/2000 |
| JP | 03-023294 | 1/1991 | JP | 2000-087029 | 3/2000 |
| JP | 03-023299 | 1/1991 | JP | 2000-138094 | 5/2000 |
| JP | 03-044967 | 2/1991 | JP | 2000-178735 | 6/2000 |
| JP | 03-048421 | 3/1991 | JP | 2000-218445 | 8/2000 |
| JP | 03-070124 | 3/1991 | JP | 2000-319772 | 11/2000 |
| JP | 03-185716 | 8/1991 | JP | 2000-340883 | 12/2000 |
| JP | 03-208885 | 9/1991 | JP | 2000-353666 | 12/2000 |
| JP | 03-234025 | 10/1991 | JP | 2001-020075 | 1/2001 |
| JP | 03-286522 | 12/1991 | JP | 2001-062244 | 3/2001 |
| JP | 03-286531 | 12/1991 | JP | 2001-111000 | 4/2001 |
| JP | 04-031391 | 2/1992 | JP | 2001-152339 | 6/2001 |
| JP | 04-031396 | 2/1992 | JP | 2001-172767 | 6/2001 |
| JP | 04-100292 | 4/1992 | JP | 2001-189312 | 7/2001 |
| JP | 04-111418 | 4/1992 | JP | 2001-217206 | 8/2001 |
| JP | 04-132214 | 5/1992 | JP | 2001-220287 | 8/2001 |
| JP | 04-132681 | 5/1992 | JP | 2001-220294 | 8/2001 |
| JP | 04-151822 | 5/1992 | JP | 2001-240972 | 9/2001 |
| JP | 04-162418 | 6/1992 | JP | 2001-254181 | 9/2001 |
| JP | 04-175299 | 6/1992 | JP | 2001-284042 | 10/2001 |
| JP | 04-186824 | 7/1992 | JP | 2001-303251 | 10/2001 |
| JP | 04-212411 | 8/1992 | JP | 2001-328900 | 11/2001 |
| JP | 04-260696 | 9/1992 | WO | WO 90/02216 | 3/1990 |
| JP | 04-273120 | 9/1992 | WO | WO 91/10510 | 7/1991 |
| JP | 04-285167 | 10/1992 | WO | WO 93/02111 | 2/1993 |
| JP | 04-291916 | 10/1992 | WO | WO 96/17107 | 6/1996 |
| JP | 04-325500 | 11/1992 | WO | WO 96/18756 | 6/1996 |
| JP | 04-328874 | 11/1992 | WO | WO 98/06889 | 2/1998 |
| JP | 05-029228 | 2/1993 | WO | WO 98/51838 | 11/1998 |
| JP | 05-047665 | 2/1993 | WO | WO 99/01595 | 1/1999 |
| JP | 05-047666 | 2/1993 | WO | WO 99/13504 | 3/1999 |
| JP | 05-047668 | 2/1993 | WO | WO 99/29924 | 6/1999 |
| JP | 05-074717 | 3/1993 | WO | WO 99/41423 | 8/1999 |
| JP | 05-074724 | 3/1993 | WO | WO 99/65064 | 12/1999 |
| JP | 05-102189 | 4/1993 | WO | WO 00/11721 | 3/2000 |
| JP | 05-160152 | 6/1993 | WO | WO 00/15865 | 3/2000 |
| JP | 05-175143 | 7/1993 | WO | WO 00/15881 | 3/2000 |
| JP | 05-175145 | 7/1993 | WO | WO 00/16377 | 3/2000 |
| JP | 05-182906 | 7/1993 | WO | WO 00/54320 | 9/2000 |
| JP | 05-186295 | 7/1993 | WO | WO 00/63957 | 10/2000 |
| JP | 05-206036 | 8/1993 | WO | WO 00/79019 | 12/2000 |
| JP | 05-234899 | 9/1993 | WO | WO 00/79576 | 12/2000 |
| JP | 05-235047 | 9/1993 | WO | WO 01/15220 | 3/2001 |
| JP | 05-251339 | 9/1993 | WO | WO 01/17692 | 3/2001 |
| JP | 05-270997 | 10/1993 | WO | WO 01/27346 | 4/2001 |
| JP | 05-283336 | 10/1993 | WO | WO 01/27347 | 4/2001 |
| JP | 05-291152 | 11/1993 | WO | WO 01/29280 | 4/2001 |
| JP | 05-304334 | 11/1993 | WO | WO 01/29891 | 4/2001 |
| JP | 05-343327 | 12/1993 | WO | WO 01/29893 | 4/2001 |
| JP | 05-343685 | 12/1993 | WO | WO 01/36702 | 5/2001 |
| JP | 06-045606 | 2/1994 | WO | WO 01/40541 | 6/2001 |
| JP | 06-132236 | 5/1994 | WO | WO 01/66832 | 9/2001 |
| JP | 06-177381 | 6/1994 | WO | WO 02/01628 | 1/2002 |
| JP | 06-196809 | 7/1994 | WO | WO 02/08485 | 1/2002 |
| JP | 06-222388 | 8/1994 | WO | WO 02/43115 | 5/2002 |

| | | |
|---|---|---|
| WO | WO 02/45167 | 6/2002 |
| WO | WO 02/45871 | 6/2002 |
| WO | WO 02/46489 | 6/2002 |
| WO | WO 02/067319 | 8/2002 |
| WO | WO 2004/106584 | 12/2004 |
| WO | WO 2005/027211 | 3/2005 |

OTHER PUBLICATIONS

Bader, et al. "Integrated Processing Equipment," Solid State Technology, Cowan Pub., vol. 33, No. 5 (May 1, 1990), pp. 149-154.

Bedair "Atomic Layer Epitaxy Deposition Processes," J. Vac. Sci. Technol. 12(1) (Jan./Feb. 1994).

Cameron, et al. "Atomic Layer Deposition of $SiO_2$ and $TiO_2$ in Alumina Tubular Membranes," Langmuir, vol. 16, No. 19, American Chemical Society, 2000 pp. 7435-7444.

Choi, et al. "Stability of $TiB_2$ as a Diffusion Barrier on Silicon," J. Electrochem. Soc. 138(10) (Oct. 1991), pp. 3062-3067.

Choi, et al. "The Effect of Annealing on Resistivity of Low Pressure Chemical Vapor Deposited Titanium Diboride," J. Appl. Phys. 69(11) (Jun. 1, 1991), pp. 7853-7861.

Clark-Phelps, et al. "Engineered Tantalum Aluminate and Hafnium Aluminate ALD Films for Ultrathin Dielectric Films with Improved Electrical and Thermal Properties," Mat. Res. Soc. Symp. Proc. vol. 670 (2001).

Derbyshire "Applications of Integrated Processing," Solid State Technology, US, Cowan Pub., vol. 37, No. 12 (Dec. 1, 1994), pp. 45-47.

Eisenbraum, et al. "Atomic Layer Deposition (ALD) of Tantalum-based materials for zero thickness copper barrier applications," Proceedings of the IEEE 2001 International Interconnect Technology Conference Cat. No. 01EX461) 2001.

Elam, et al. "Nucleation and Growth During Tungsten Atomic Layer Deposition on $SiO_2$ Surfaces," Thin Solid Films, 386, (2001), pp. 41-52.

Elers, et al. "$NbCl_5$ As a Precursor in Atomic Layer Epitaxy," Appl. Surf. Sci., vol. 82/83 (1994), pp. 468-474.

George, et al. "Atomic Layer Controlled Deposition of $SiO_2$ and $Al_2O_3$ Using ABAB . . . Binary Reaction Sequence Chemistry," Appl. Surf. Sci., vol. 82/83 (1994), pp. 460-467.

George, et al. "Surface Chemistry for Atomic Layer Growth," J. Phys. Chem. 1996, 100, 13121-13131.

Goswami, et al. Transition Metals Show Promise as Copper Barriers, Semiconductor International, ATMI, San Jose—May 1, 2004, Semiconductor International, pp. 1-7.

Hong, et al. "Characteristics of PAALD-TaN thin films derived from TAIMATA precursor for copper metallization", Internconnect Technology Conference, 2004. Proceedings of the IEEE 2004 International, Jun. 7-9, 2004, pp. 9-11.

Hultman, et al. "Review of the Thermal and Mechanical Stability of TiN-based Thin Films," Zeitschrift Fur Metallkunde, 90(10) (Oct. 1999), pp. 803-813.

Hwang, et al. "Nanometer-Size α-$PbO_2$-type $TiO_2$ in Garnet: A Thermobarometer for Ultrahigh-Pressure Metamorphism," Science Vo. 288 (Apr. 14, 2000).

IBM Tech. Disc. Bull. "Knowledge-Based Dynamic Scheduler in Distributed Computer Control," (Jun. 1990), pp. 80-84.

IBM Tech. Disc. Bull. "Multiprocessor and Multitasking Architecture for Tool Control of the Advanced via Inspection Tools," (May 1992), pp. 190-191.

Kim, et al. "Atomic Layer Deposition of Low Resistivity and High-Density Tungsten Nitride Thin Film Using $B_2H_6$, $WF_6$ and $NH_3$," Electrochem. Solid-State Lett., vol. 9, Issue 3, (2006), pp. C54-C57.

Kitigawa, et al. "Hydrogen-mediated Low Temperature Epitaxy of Si in Plasma-enhanced Chemical Vapor Deposition," Applied Surface Science (2000), pp. 30-34.

Klaus, et al. "Atomic Layer Deposition of $SiO_2$ Using Catalyzed and Uncatalyzed Self-Limiting Surface Reactions," Surface Review and Letters, vol. 6, Nos. 3 & 4 (1999) 435-448.

Klaus, et al. "Atomic Layer Deposition of Tungsten using Sequential Surface Chemistry with a Sacrificial Stripping Reaction," Thin Solid Films 360 (2000), pp. 145-153. (Accepted Nov. 16, 1999).

Klaus, et al. "Atomically Controlled Growth of Tungsten and Tungsten Nitride Using Sequential Surface Reactions," Applied Surface Science, 162-163 (2000), pp. 479-491.

Kukli, et al. "Atomic Layer Epitaxy Growth of Tantalum Oxide Thin Films from $Ta(OC_2H_5)_5$ and $H_2O$," Journal of the Electrochemical Society, vol. 142, No. 5, May 1995; p. 1670-5.

Kukli, et al. "In situ Study of Atomic Layer Epitaxy Growth of Tantalum Oxide Thin Films From $Ta(OC_2H_5)_5$ and $H_2O$," Applied Surface Science, vol. 112, Mar. 1997, p. 236-42.

Kukli, et al. "Properties of $\{Nb_{1-x}Ta_x\}_2O_5$-$ZrO_2$ Nanolaminates Grown by Atomic Layer Epitaxy," 1997; p. 785-93.

Kukli, et al. "Properties of $Ta_2O_5$-Based Dielectric Nanolaminates Deposited by Atomic Layer Epitaxy," Journal of the Electrochemical Society, vol. 144, No. 1, Jan. 1997; p. 300-6.

Kukli, et al. "Tailoring the Dielectric Properties of $HfO_2$-$Ta_2O_5$ Nanolaminates," Applied Physics Letters, vol. 68, No. 26, Jun. 24, 1996; p. 3737-9.

Lee, "The Preparation of Titanium-Based Thin Film by CVD Using Titanium Chlorides as Precursors," Chemical Vapor Deposition, 5(2) (Mar. 1999), pp. 69-73.

Lee, et al. "Pulsed Nucleation for Ultra-High Aspect Ration Tungsten Plugfill," Materials Research Society, 2002, pp. 649-653.

Martensson, et al. "Atomic Layer Epitaxy of Copper on Tantalum," Chemical Vapor Deposition, 3(1) (Feb. 1, 1997), pp. 45-50.

Martensson, et al. "Atomic Layer Epitaxy of Copper, Growth & Selectivity in the Cu (II)-2,2.6,6-Tetramethyl-3, 5-Heptanedion ATE/H2 Process," J. Electrochem. Soc., 145(8) (Aug. 1998), pp. 2926-2931.

Martensson, et al. "Use of Atomic Layer Epitaxy for Fabrication of Si/TiN/Cu Structures," J. Vac. Sci. & Tech. B, vol. 17, No. 5, (Sep. 1999) pp. 2122-2128.

Maydan "Cluster Tools for Fabrication of Advanced Devices," Jap. J. of Applied Physics, Extended Abstracts, 22nd Conference Solid State Devices and Materials (1990), pp. 849-852.

McGeachin "Synthesis and Properties of Some α-diketimines Derived From Acetylacetone, and Their Metal Complexes," Canadian J. of Chemistry, vol. 46 (1968), pp. 1903-1912.

Min, et al. "Atomic Layer Deposition of TiN Thin Films by Sequential Introduction of Ti Precursor and $NH_3$," Mat. Res. Soc. Symp. Proc. vol. 514 (1998).

Min, et al. "Chemical Vapor Depositon of Ti—Si—N Films with Alternating Source Supply," Mat., Res. Soc. Symp. Proc., vol. 564 (Apr. 5, 1999), pp. 207-210.

Min, et al. "Metal-organic Atomic-layer Deposition of Titanium-silicon-nitride films," Applied Physics Letters, vol. 75, No. 11 (Sep. 13, 1999).

Niinisto, et al. "Synthesis of Oxide Films and Overlayers by Atomic Layer Epitaxy for Advanced Applications," Materials Science and Engineering B41 (1996) 23-29.

Ohba, et al. "Thermal Decomposition of Methylhydrazine and Deposition Properties of CVD TiN Thin Films," Conference Proceedings, Advanced Metallization for ULSI Applications in 1993 (1994), pp. 143-149.

Park, et al. "Performance improvement of MOSFET with $HfO_2$—$Al_2O_3$ laminate gate dielectric and CVD-TaN metal gate deposited by TAIMATA", Electron Devices Meeting, 2003. IEDM '03 Technical Digest. IEEE International Dec. 8-10, 2003, pp. 13.6.1-13.6.4.

Proceedings of the ICEEE 1998 International Interconnect Technology Conference—San Francisco, California, Jun. 1-3, 1998.

Ritala, et al. "Atomic Force Microscopy Study of Titanium Dioxide Thin Films Grown by Atomic Layer Epitaxy," Thin Solid Films, vol. 228, No. 1-2 (May 15, 1993), pp. 32-35.

Ritala, et al. "Atomic Layer Epitaxy Growth of TiN Thin Films From $TiI_4$ and $NH_3$," J. Electrochem. Soc., vol. 145, No. 8 (Aug. 1998) pp. 2914-2920.

Ritala, et al. "Atomic Layer Epitaxy Growth of TiN Thin Films," J. Electrochem. Soc., 142(8) (Aug. 1995), pp. 2731-2737.

Ritala, et al. "Effects of Intermediate Zinc Pulses on Properties of TiN and NbN Films by Atomic Layer Epitaxy," Applied Surface Science, vol. 120, No. 3-4, (Dec. 1997), pp. 199-212.

Ritala, et al. "Growth of Titanium Dioxide Thin Films by Atomic Layer Epitaxy," Thin Solid Films, vol. 225, No. 1-2 (Mar. 25, 1993) pp. 288-295.

Ritala, et al. "Perfectly Conformal TiN and $Al_2O_3$ Films Deposited by Atomic Layer Deposition," Chemical Vapor Deposition, Jan. 1999, 5, No. 1, pp. 6-9.

Ritala, et al. "Surface Roughness Reduction in Atomic Layer Epitaxy Growth of Titanium Dioxide Thin Films," Thin Solid-Films, vol. 249, No. 2 (Sep. 15, 1994), pp. 155-162.

Rossnagel, et al. "Plasma-enhanced Atomic Layer Deposition of Ta and Ti for Interconnect Diffusion Barriers," J. Vacuum Sci. & Tech. B., vol. 18, No. 4 (Jul. 2000), pp. 2016-2020.

Scheper, et al. "Low-temperature Deposition of Titanium Nitride Films From Dialkylhydrazine-based Precursors," Materials Science in Semiconductor Processing 2 (1999), pp. 149-157.

Shenai, et al. "Correlation of vapor pressure equation and film properties with trimethylindium purity for the MOVPE grown III-V compounds," Journal of Crystal Growth 248 (2003) pp. 91-98.

Solanki, et al. "Atomic Layer Deposition of Copper Seed Layers," Electrochemical and Solid State Letters, 3(10) (2000), pp. 479-480.

Suzuki, et al. "A 0.2-μm Contact Filing by 450° C.-hydrazine-reduced TiN film With Low Resistivity," IEDM 92-979, pp. 11.8.1-11.8.3.

Suzuki, et al. "LPCVD-TiN Using Hydrazine and $TiCl_4$," VMIC Conference (Jun. 8-9, 1993), pp. 418-423.

Wise, et al. "Diethyldiethoxysilane as a New Precursor for $SiO_2$ Growth on Silicon", Mat. Res. Soc. Symp. Proc., vol. 334 (1994), pp. 37-43.

Yamaga, et al. "Atomic Layer Epitaxy of ZnS by a New Gas Supplying System in a Low-pressure Metalorganic Vapor Phase Epitaxy," J. of Crystal Growth 117 (1992), pp. 152-155.

Yamaguchi, et al. "Atomic-layer Chemical-Vapor-Deposition of Silicon Dioxide Films With Extremely Low Hydrogen Content," Appl. Surf. Sci., vol. 130-132 (1998), pp. 202-207.

Yang, et al. "Atomic Layer Deposition of Tungsten Film from $WF_6/B_2H_6$: Nucleation Layer for Advanced Semiconductor Devices," Conference Proceedings ULSI XVII (2002), Materials Research Society, pp. 655-660.

\* cited by examiner

METHOD FOR FORMING TUNGSTEN MATERIALS DURING VAPOR DEPOSITION PROCESSES

CROSS-REFERENCE TO RELATED APPLICATIONS

This application is a continuation of U.S. Ser. No. 11/468,156, filed Aug. 29, 2006, and issued as U.S. Pat. No. 7,235,486, which is a continuation of U.S. Ser. No. 11/338,565, filed Jan. 24, 2006, and issued as U.S. Pat. No. 7,115,494, which is a continuation of U.S. Ser. No. 10/951,354, filed Sep. 29, 2004, and issued as U.S. Pat. No. 7,033,922, which is a continuation of U.S. Ser. No. 09/625,336, filed Jul. 25, 2000, and issued as U.S. Pat. No. 6,855,368, which is a divisional of U.S. Ser. No. 09/605,593, filed Jun. 28, 2000, and issued as U.S. Pat. No. 6,551,929, which are herein incorporated by reference in their entirety.

BACKGROUND OF THE INVENTION

1. Field of the Invention

This invention relates to the processing of semiconductor substrates. More particularly, this invention relates to improvements in the process of depositing refractory metal layers on semiconductor substrates.

2. Description of the Related Art

The semiconductor processing industry continues to strive for larger production yields while increasing the uniformity of layers deposited on substrates having increasing larger surface areas. These same factors in combination with new materials also provide higher integration of circuits per unit area of the substrate. As circuit integration increases, the need for greater uniformity and process control regarding layer thickness rises. As a result, various technologies have been developed to deposit layers on substrates in a cost-effective manner, while maintaining control over the characteristics of the layer. Chemical vapor deposition (CVD) is one of the most common deposition processes employed for depositing layers on a substrate. CVD is a flux-dependent deposition technique that requires precise control of the substrate temperature and precursors introduced into the processing chamber in order to produce a desired layer of uniform thickness. These requirements become more critical as substrate size increases, creating a need for more complexity in chamber design and gas flow technique to maintain adequate uniformity.

A variant of CVD that demonstrates superior step coverage, compared to CVD, is atomic layer deposition (ALD). ALD is based upon atomic layer epitaxy (ALE) that was originally employed to fabricate electroluminescent displays. ALD employs chemisorption to deposit a saturated monolayer of reactive precursor molecules on a substrate surface. This is achieved by alternatingly pulsing an appropriate reactive precursor into a deposition chamber. Each injection of a reactive precursor is separated by an inert gas purge to provide a new atomic layer additive to previous deposited layers to form a uniform layer on the substrate. The cycle is repeated to form the layer to a desired thickness. A drawback with ALD techniques is that the deposition rate is much lower than typical CVD techniques by at least one order of magnitude.

Employing the aforementioned deposition techniques it is seen that formation of a layer at a high deposition rate while providing adequate step coverage are conflicting characteristics often necessitating sacrificing one to obtain the other. This has been prevalent when depositing refractory metal layers to cover gaps or vias during formation of contacts that interconnect adjacent metallic layers separated by a dielectric layer. Historically, CVD techniques have been employed to deposit conductive material in order to inexpensively and quickly form contacts. Due to the increasing integration of semiconductor circuitry, tungsten has been used based upon the superior step coverage of tungsten. As a result, deposition of tungsten employing CVD techniques enjoys wide application in semiconductor processing due to the high throughput of the process.

Depositing tungsten in this manner, however, is attendant with several disadvantages. For example, blanket deposition of a tungsten layer on a semiconductor wafer is time-consuming at temperatures below 400° C. The deposition rate of tungsten may be improved by increasing the deposition temperature to, e.g., about 500° C. to about 550° C. Temperatures in this range may compromise the structural and operational integrity of the underlying portions of the integrated circuit being formed. Tungsten has also frustrated photolithography steps during the manufacturing process by providing a relatively rough surface having a reflectivity of 20% or less than that of a silicon substrate. Finally, tungsten has proven difficult to deposit uniformly. This has been shown by variance in tungsten layers' thickness of greater than 1%, which frustrates control of the resistivity of the layer. Several prior attempts to overcome the aforementioned drawbacks have been attempted.

For example, in U.S. Pat. No. 5,028,565, which is assigned to the assignee of the present invention, a method is disclosed to improve, inter alia, uniformity of tungsten layers by varying the deposition chemistry. The method includes, in pertinent part, formation of a nucleation layer over an intermediate barrier layer before depositing the tungsten layer via bulk deposition. The nucleation layer is formed from a gaseous mixture of tungsten hexafluoride, hydrogen, silane and argon. The nucleation layer is described as providing a layer of growth sites to promote uniform deposition of a tungsten layer. The benefits provided by the nucleation layer are described as being dependent upon the barrier layer present. For example, were the barrier layer formed from titanium nitride, the tungsten layer's thickness uniformity is improved as much as 15%. The benefits provided by the nucleation layer are not substantial if the barrier layer is formed from sputtered tungsten or sputtered titanium tungsten.

A need exists, therefore, to provide techniques to improve the characteristics of refractory metal layers deposited on semiconductor substrates.

SUMMARY OF THE INVENTION

A method and system reduces the resistance of contacts of refractory metal layers by controlling the presence of fluorine contained therein. The present invention is based upon the discovery that when employing ALD techniques to form refractory metal layers on a substrate, the carrier gas employed impacts the presence of fluorine in the resulting layer. As a result, the method features chemisorbing onto the substrate alternating monolayers of a first compound and a second compound, with the second compound having fluorine atoms associated therewith, with each of the first and second compounds being introduced into the processing chamber along with a carrier gas; and controlling a quantity of the fluorine atoms associated with the monolayer of the second compound as a function of the carrier gas. Specifically, it was found that by introducing the first and second compounds employing $H_2$ as a carrier gas, the amount of fluorine present in the resulting refractory metal layer was substantially reduced, compared to employing either nitrogen ($N_2$) or argon as a carrier gas.

To that end, the system includes a processing chamber, having a holder, disposed therein to support the substrate. A gas delivery system and a pressure control system are in fluid communication with the processing chamber. A temperature control system is in thermal communication therewith. A controller is in electrical communication with gas delivery system, temperature control system, and the pressure control system. A memory is in data communication with the controller. The memory comprises a computer-readable medium having a computer-readable program embodied therein. The computer-readable program includes instructions for controlling the operation of the processing chamber.

DETAILED DESCRIPTION OF THE INVENTION

Figure 1:
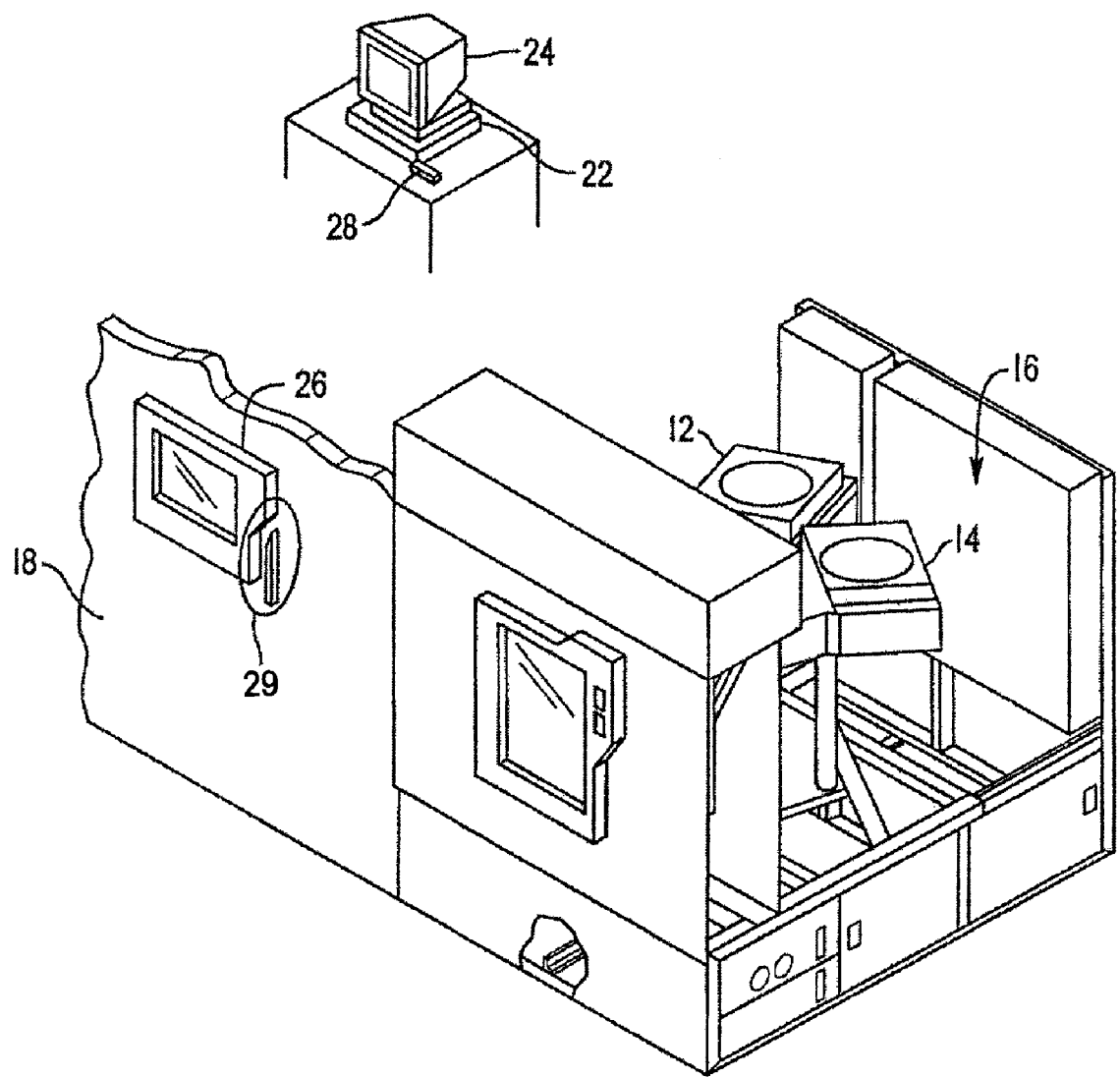
FIG. 1 is a perspective view of a semiconductor processing system in accordance with the present invention.

Referring to FIG. 1, an exemplary wafer processing system includes two or more processing chambers 12 and 14 disposed in a common work area 16 surrounded by a wall 18. The processing chambers 12 and 14 are in data communication with a controller 22 that is connected to one or more monitors, shown as 24 and 26. The monitors typically display common information concerning the process associated with the processing chambers 12 and 14. One of the monitors 26 is mounted to the wall 18, with the remaining monitor 24 being disposed in the work area 16. Operational control of the processing chambers 12 and 14 may be achieved use of a light pen, associated with one of the monitors 24 and 26, to communicate with the controller 22. For example, light pen 28 is associated with monitor 24 and facilitates communication with the controller 22 through monitor 24. Light pen 29 facilitates communication with the controller 22 through monitor 26.

Figure 2:
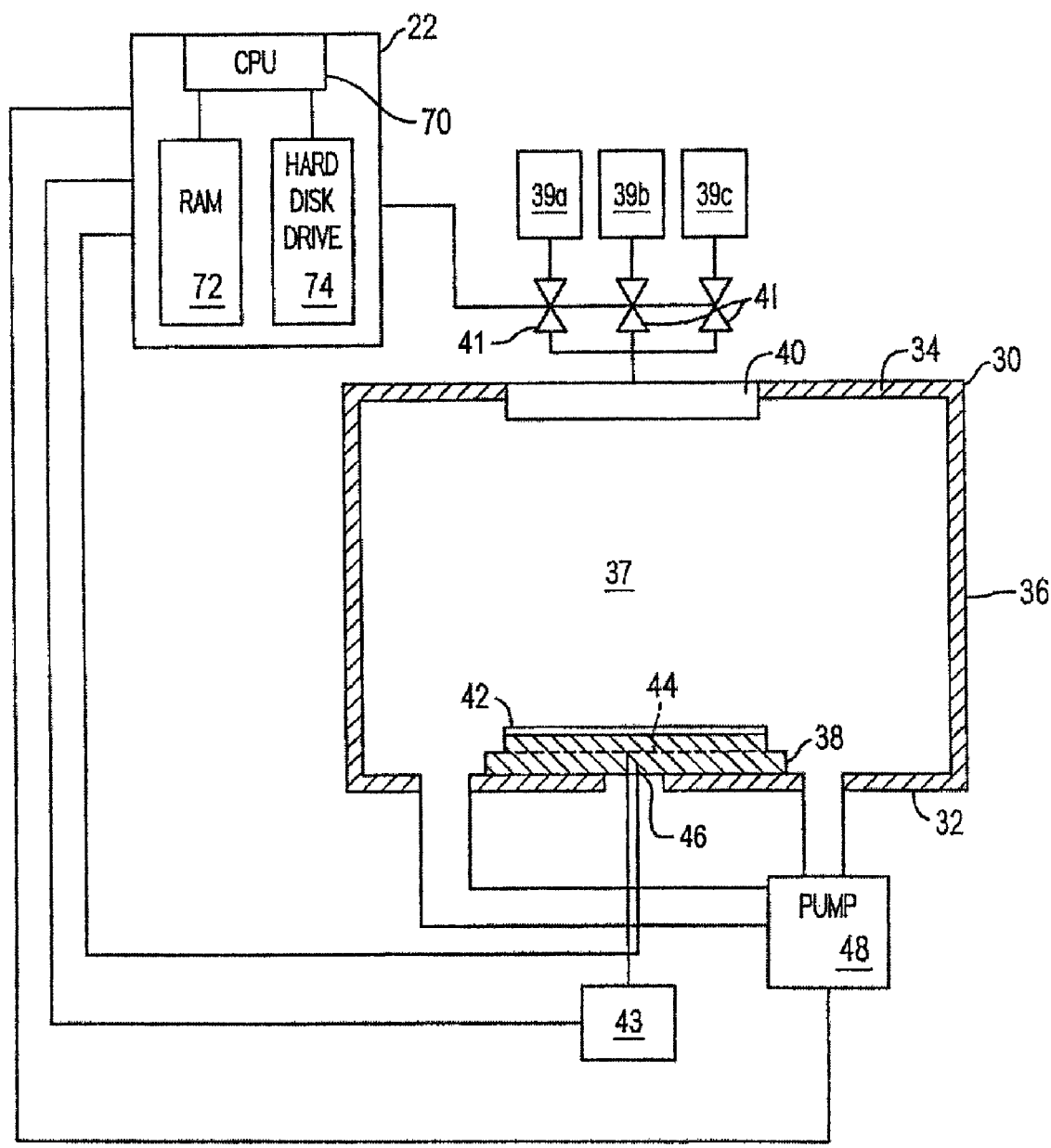
FIG. 2 is a detailed view of the processing chambers shown above in FIG. 1.

Referring both to FIGS. 1 and 2, each of the processing chambers 12 and 14 includes a housing 30 having a base wall 32, a cover 34, disposed opposite to the base wall 32, and a sidewall 36, extending therebetween. The housing 30 defines a chamber 37, and a pedestal 38 is disposed within the processing chamber 37 to support a substrate 42, such as a semiconductor wafer. The pedestal 38 may be mounted to move between the cover 34 and the base wall 32, using a displacement mechanism (not shown). Supplies of processing gases 39a, 39b, and 39c are in fluid communication with the processing chamber 37 via a showerhead 40. Regulation of the flow of gases from the supplies 39a, 39b and 39c is effectuated via flow valves 41.

Depending on the specific process, the substrate 42 may be heated to a desired temperature prior to layer deposition via a heater embedded within the pedestal 38. For example, the pedestal 38 may be resistively heated by applying an electric current from an AC power supply 43 to the heater element 44. The wafer 40 is, in turn, heated by the pedestal 38, and can be maintained within a desired process temperature range of, for example, about 20° C. to about 750° C. A temperature sensor 46, such as a thermocouple, is also embedded in the wafer support pedestal 38 to monitor the temperature of the pedestal 38 in a conventional manner. For example, the measured temperature may used in a feedback loop to control the electrical current applied to the heater element 44 by the power supply 43, such that the wafer temperature can be maintained or controlled at a desired temperature which is suitable for the particular process application. The pedestal 38 is optionally heated using radiant heat (not shown). A vacuum pump 48 is used to evacuate the processing chamber 37 and to help maintain the proper gas flows and pressure inside the processing chamber 37.

Figure 3:
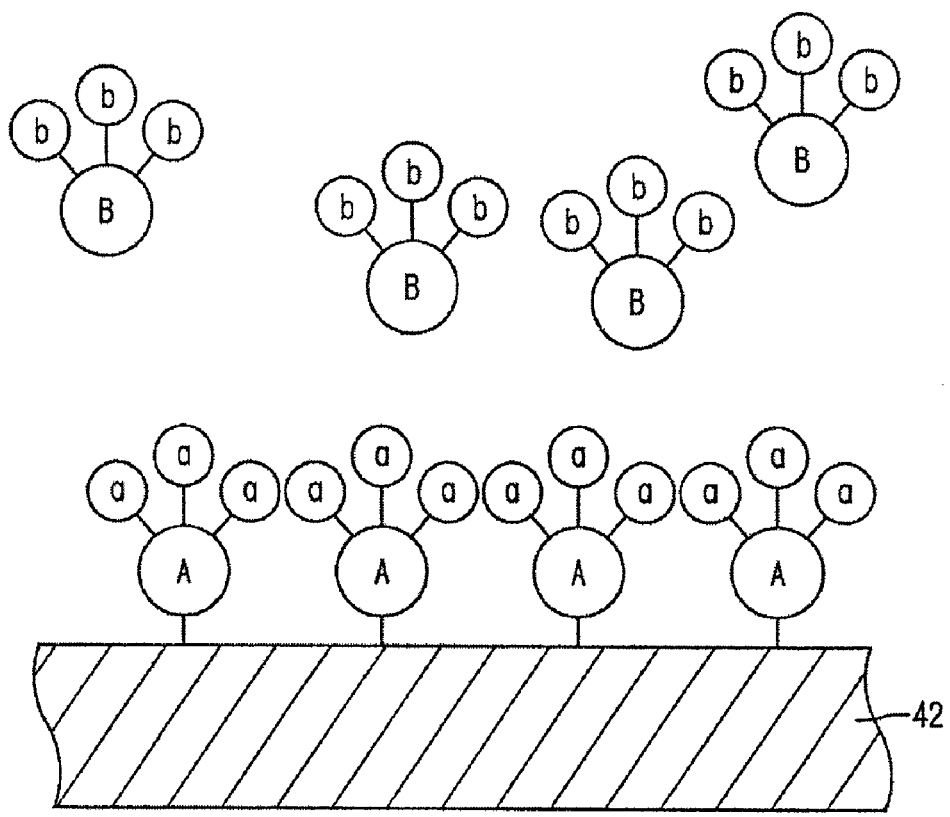
FIG. 3 is a schematic view showing deposition of a first molecule onto a substrate during ALD.

Referring to FIGS. 1 and 3, one or both of the processing chambers 12 and 14, discussed above may operate to deposit refractory metal layers on the substrate employing ALD techniques. Depending on the specific stage of processing, the refractory metal layer may be deposited on the material from which the substrate 42 is fabricated, e.g., $SiO_2$. The refractory metal layer may also be deposited on a layer previously formed on the substrate 42, e.g., titanium, titanium nitride and the like.

ALD proceeds by chemisorption. The initial surface of the substrate 42 presents an active ligand to the process region. A batch of a first processing gas, in this case $Aa_x$, results in a layer of "A" being deposited on the substrate 42 having a surface of ligand "a" exposed to the processing chamber 37. Thereafter, a purge gas enters the processing chamber 37 to purge the gas $Aa_x$. After purging gas $Aa_x$ from the processing chamber 37, a second batch of processing gas, $Bb_y$, is introduced into the processing chamber 37. The a ligand present on the substrate surface reacts with the "b" ligand and "B" atom on the, releasing molecules ab and Ba, that move away from the substrate 42 and are subsequently pumped from the processing chamber 37. In this manner, a surface comprising a monolayer of A atoms remains upon the substrate 42 and exposed to the processing chamber 37, shown in FIG. 4. The process proceeds cycle after cycle, until the desired thickness is achieved.

Figure 5:
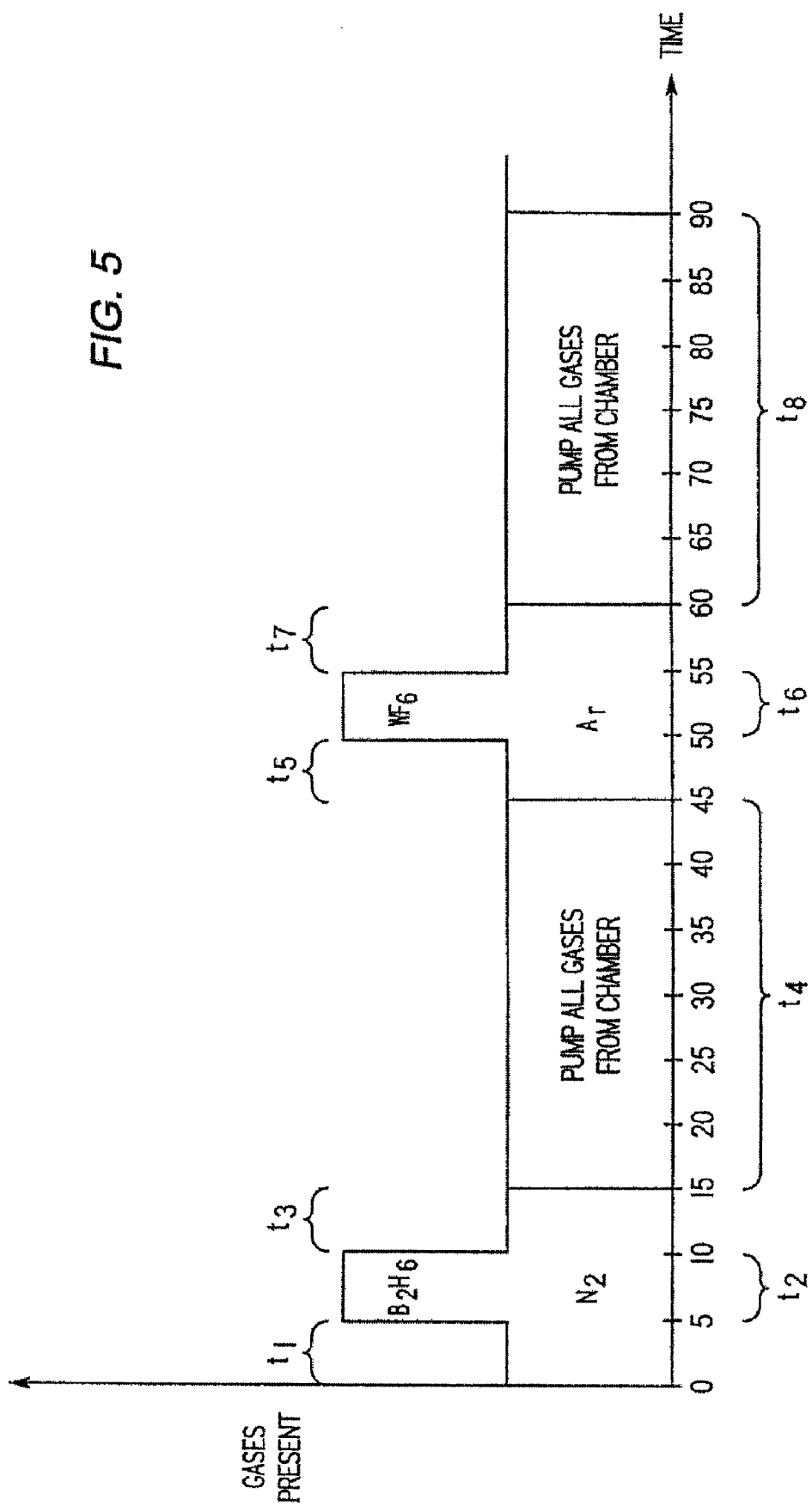
FIG. 5 is a graphical representation showing the concentration of gases introduced into the processing chamber shown above in FIG. 2, and the time in which the gases are present in the processing chamber, in accordance with the present invention.

Referring to both FIGS. 2 and 5, although any type of processing gas may be employed, in the present example, the processing gas $Aa_x$ is $WF_6$ and the processing gas $Bb_y$ is $B_2H_6$. Two purge gases were employed: Ar and $N_2$. Each of the processing gases is flowed into the processing chamber 37 with a carrier gas, which in this example were one of the purge gases: $WF_6$ is introduced with Ar and $B_2H_6$ is introduced with $N_2$. It should be understood, however, that the purge gas may differ from the carrier gas, discussed more fully below. One cycle of the ALD technique in accordance with the present invention includes flowing the purge gas, $N_2$, into the processing chamber 37 during time $t_1$, which is approximately five seconds before $B_2H_6$ is flowed into the processing chamber 37. During time $t_2$, the processing gas $B_2H_6$ is flowed into the processing chamber 37 for approximately five seconds, along with a carrier gas, which in this example is $N_2$. After five seconds have lapsed, the flow of $B_2H_6$ terminates and the flow of $N_2$ continues during time $t_3$ for an additional five seconds, purging the processing chamber of $B_2H_6$. During time $t_4$, the processing chamber 37 is pumped so as to remove all gases. The pumping process lasts approximately thirty seconds. After pumping of the process chamber 37, the carrier gas Ar is introduced for approximately five seconds during time $t_5$, after which time the process gas $WF_6$ is introduced into the processing chamber 37 for about five seconds, along with the carrier gas Ar during time $t_6$. The flow of the processing gas $WF_6$ into the processing chamber 37 is terminated approximately five seconds after it commenced. After the flow of $WF_6$ into the processing chamber 37 terminates, the flow of Ar continues for five additional seconds, during time $t_7$. Thereafter, the processing chamber 37 is pumped so as to remove all gases therein, during time $t_8$. As before, the pumping process lasts approximately thirty seconds, thereby concluding one cycle of the ALD technique in accordance with the present invention.

The benefits of employing ALD are manifold, including flux-independence of layer formation that provides uniformity of deposition independent of the size of a substrate. For example, the measured difference of the layer uniformity and thickness measured between of 200 mm substrate and a 32 mm substrate deposited in the same chamber is negligible. This is due to the self-limiting characteristics of chemisorption. Further, the chemisorption characteristics contribute to near-perfect step coverage over complex topography.

Figure 4:
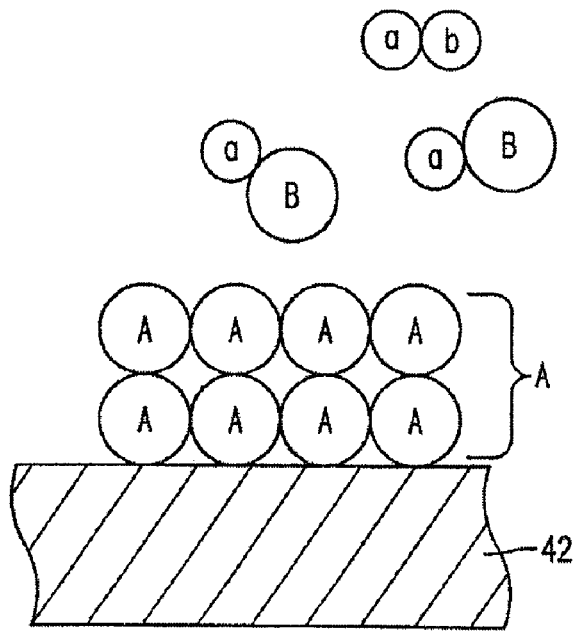
FIG. 4 is a schematic view showing deposition of second molecule onto a substrate during ALD to form a refractory metal layer.
Figure 6:
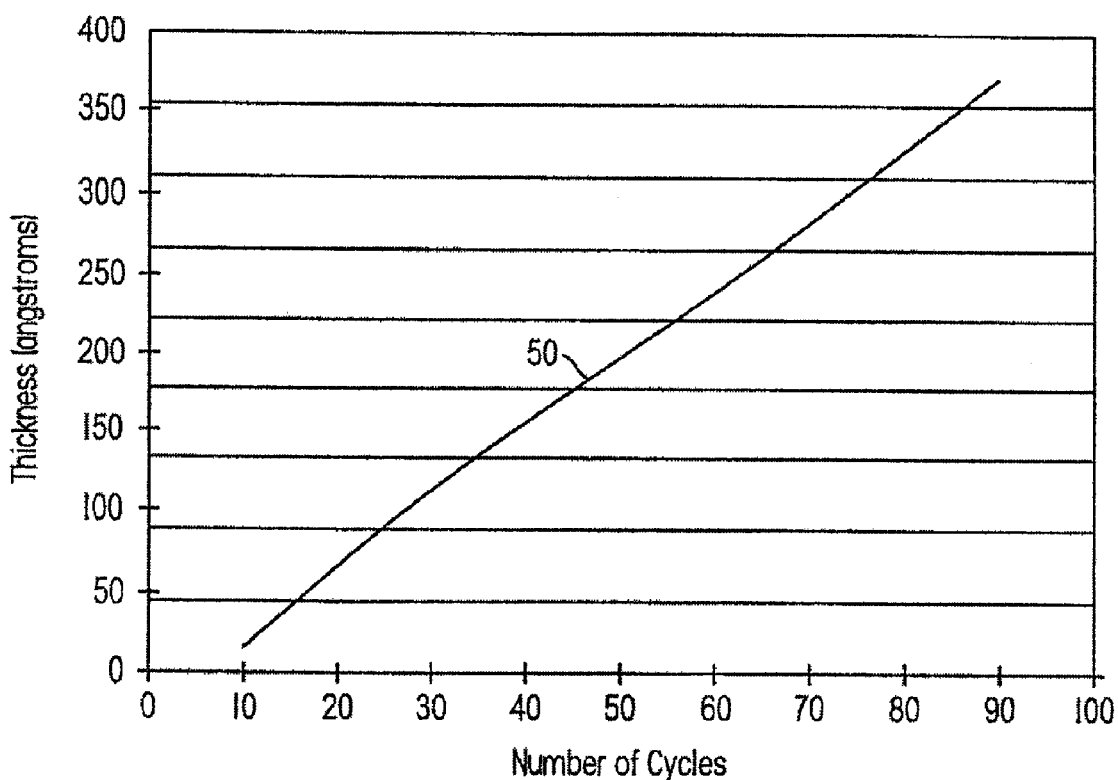
FIG. 6 is a graphical representation showing the relationship between the number of ALD cycles and the thickness of a layer formed on a substrate employing ALD, in accordance with the present invention.
Figure 7:
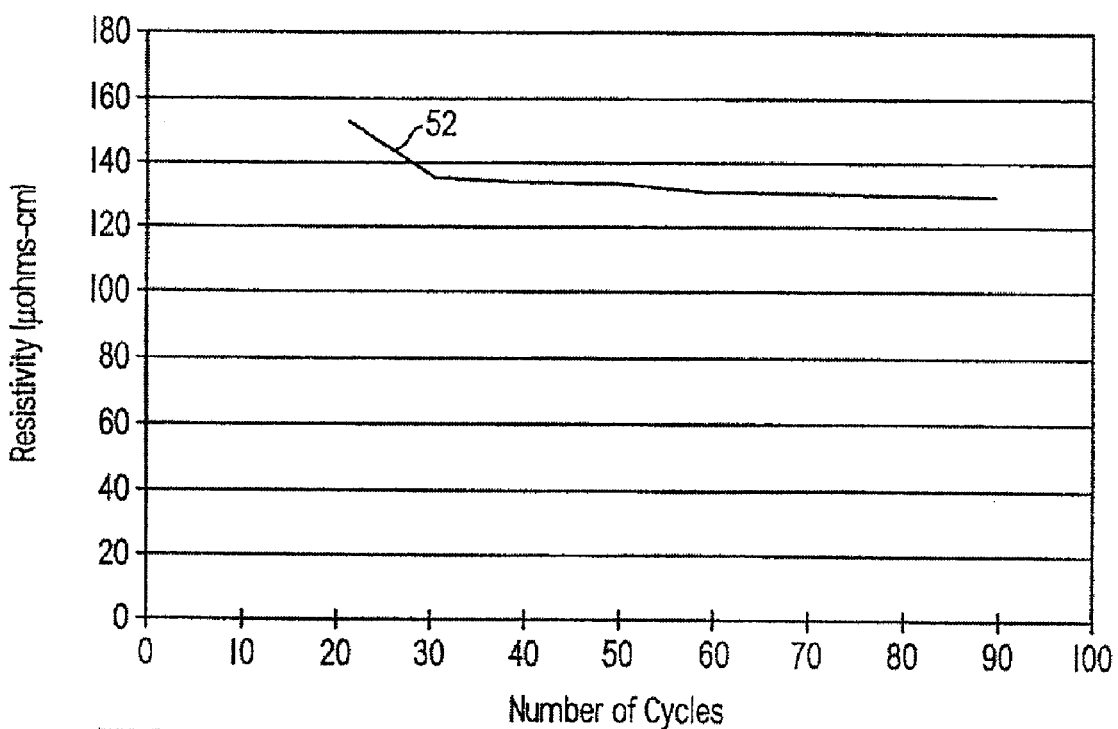
FIG. 7 is a graphical representation showing the relationship between the number of ALD cycles and the resistivity of a layer formed on a substrate employing ALD, in accordance with the present invention.

In addition, the thickness of the layer A, shown in FIG. 4, may be easily controlled while minimizing the resistance of the same by employing ALD. With reference to FIG. 6 it is seen the slope of line 50 that the thickness of the tungsten layer A is proportional to the number of cycles employed to form the same. The resistivity of the tungsten layer, however, is relatively independent of the thickness of the layer, as shown by the slope of line 52 in FIG. 7. Thus, employing ALD, the thickness of a refractory metal layer may be easily controlled as a function of the cycling of the process gases introduced into the processing chamber with a negligible effect on the resistivity.

Figure 8:
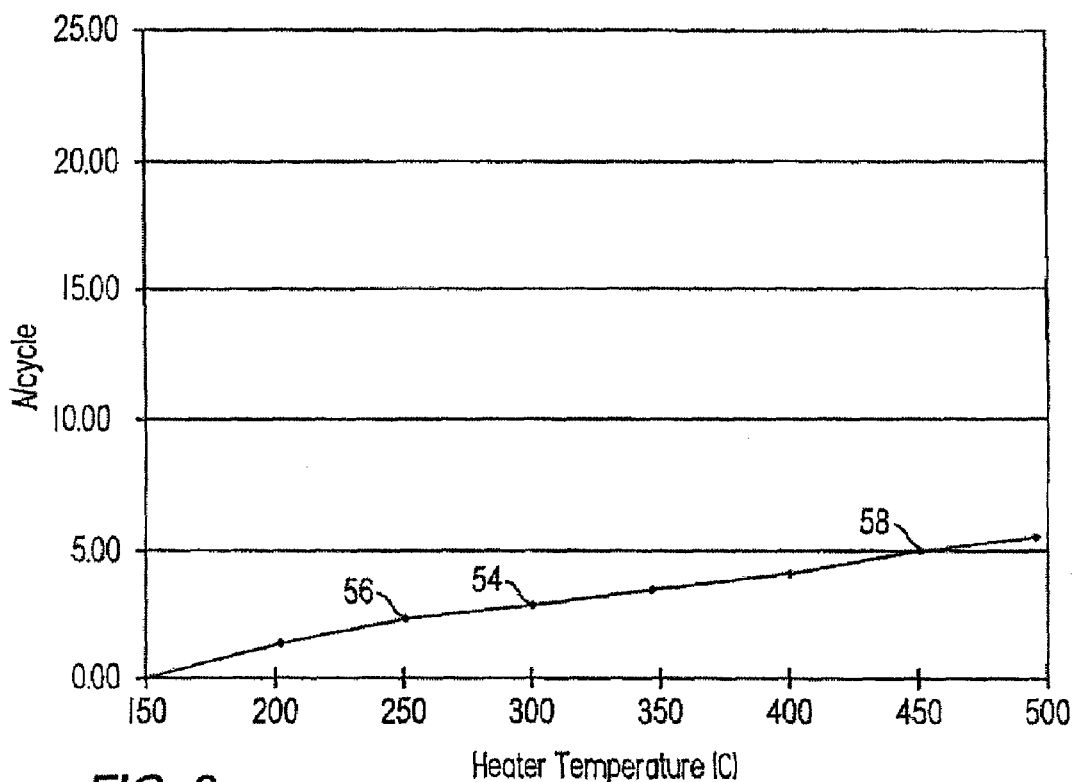
FIG. 8 is a graphical representation showing the relationship between the deposition rate of a layer formed on a substrate employing ALD and the temperature of the substrate.
Figure 9:
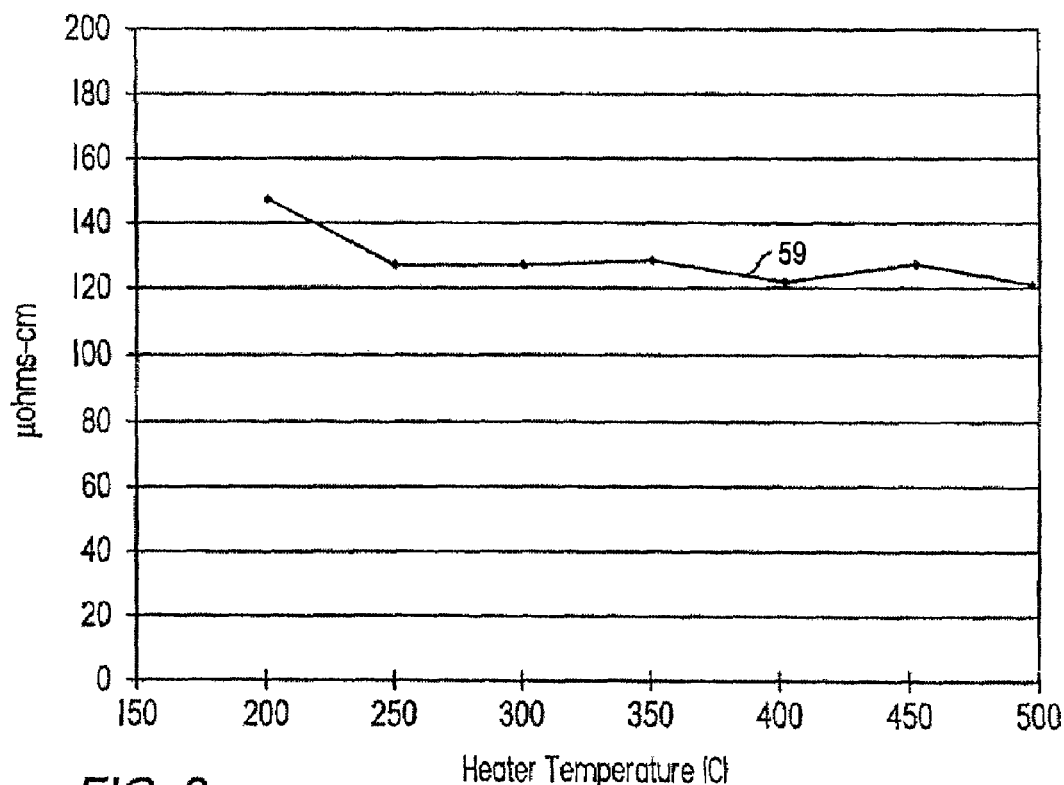
FIG. 9 is a graphical representation showing the relationship between the resistivity of a layer formed on a substrate employing ALD and the temperature of the substrate, in accordance with the present invention.

Referring to FIG. 8, control of the deposition rate was found to be dependent upon the temperature of the substrate 42. As shown by the slope of line 54, increasing the temperature of the substrate 42 increased the deposition rate of the tungsten layer A. For example, at point 56, the deposition rate is shown to be approximately 2 Å/cycle at 250° C. However at point 58 the deposition rate is approximately 5 Å/cycle at a temperature of 450° C. The resistivity of the tungsten layer, however, is virtually independent of the layer thickness, as shown by the slope of curve 59, shown in FIG. 9. As a result, the deposition rate of the tungsten layer may be controlled as a function of temperature without comprising the resistivity of the same. However, it is preferred to perform many processing steps at temperatures well below 450° C.

Figure 10:
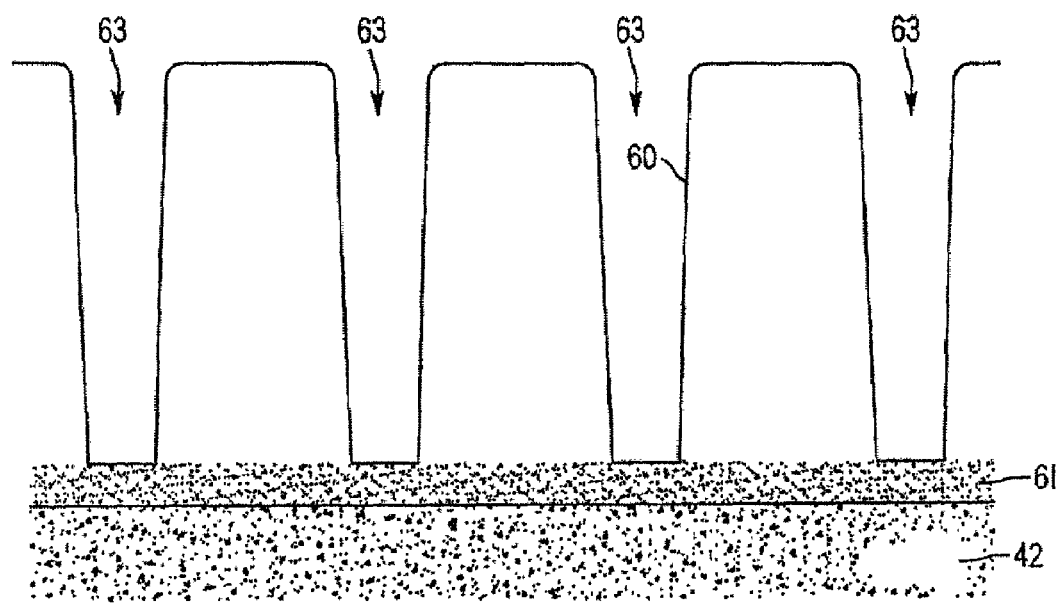
FIG. 10 is a cross-sectional view of a patterned substrate having a nucleation layer formed thereon employing ALD, in accordance with the present invention.
Figure 11:
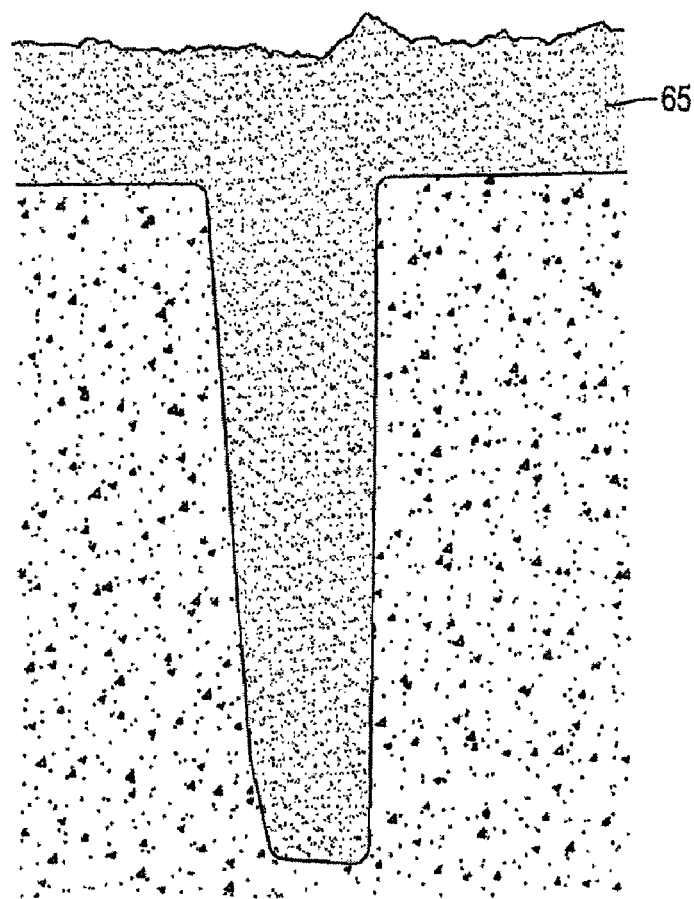
FIG. 11 is a partial cross-sectional view of the substrate, shown above in FIG. 10, with a refractory metal layer formed atop of the nucleation layer employing CVD, in accordance with the present invention.

To that end, a bifurcated deposition process may be practiced in which nucleation of the refractory metal layer occurs in a different chamber than the formation of the remaining portion of the refractory metal layer. Specifically, in the present example, nucleation of a tungsten layer occurs in chamber 12 employing the ALD techniques discussed above, with the substrate 42 being heated in the range of 200° C. to 400° C., and the processing chamber 37 being pressurized in the range of 1 to 10 Torr. A nucleation layer 60 of approximately 12 to 20 nm is formed on a patterned substrate 42, shown in FIG. 10. As shown, the substrate 42 includes a barrier layer 61 and a patterned layer having a plurality of vias 63. The nucleation layer is formed adjacent to the patterned layer covering the vias 63. As shown, forming the nucleation layer 60 employing ALD techniques provides 100% step coverage. To decrease the time required to form a complete layer of tungsten, a bulk deposition of tungsten onto the nucleation layer 60 occurs using CVD techniques, while the substrate 42 is disposed in processing chamber 14, shown in FIG. 1. The bulk deposition may be performed using recipes well known in the art. In this manner, a tungsten layer 65 providing a complete plug fill is achieved on the patterned layer with vias having aspect ratios of approximately 6:1, shown in FIG. 11.

Figure 12:
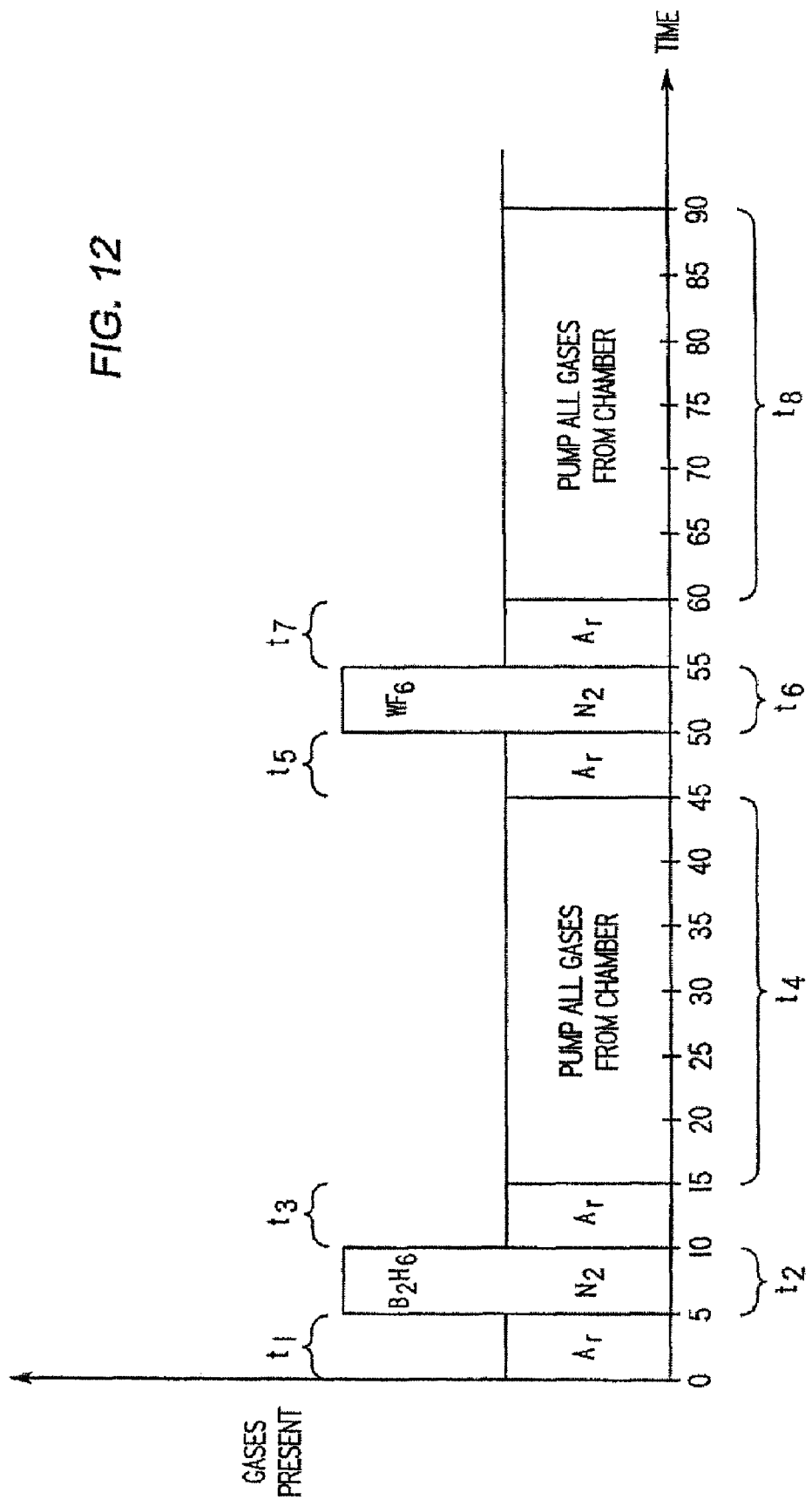
FIG. 12 is a graphical representation showing the concentration of gases shown above in FIG. 5 in accordance with a first alternate embodiment of the present invention.
Figure 13:
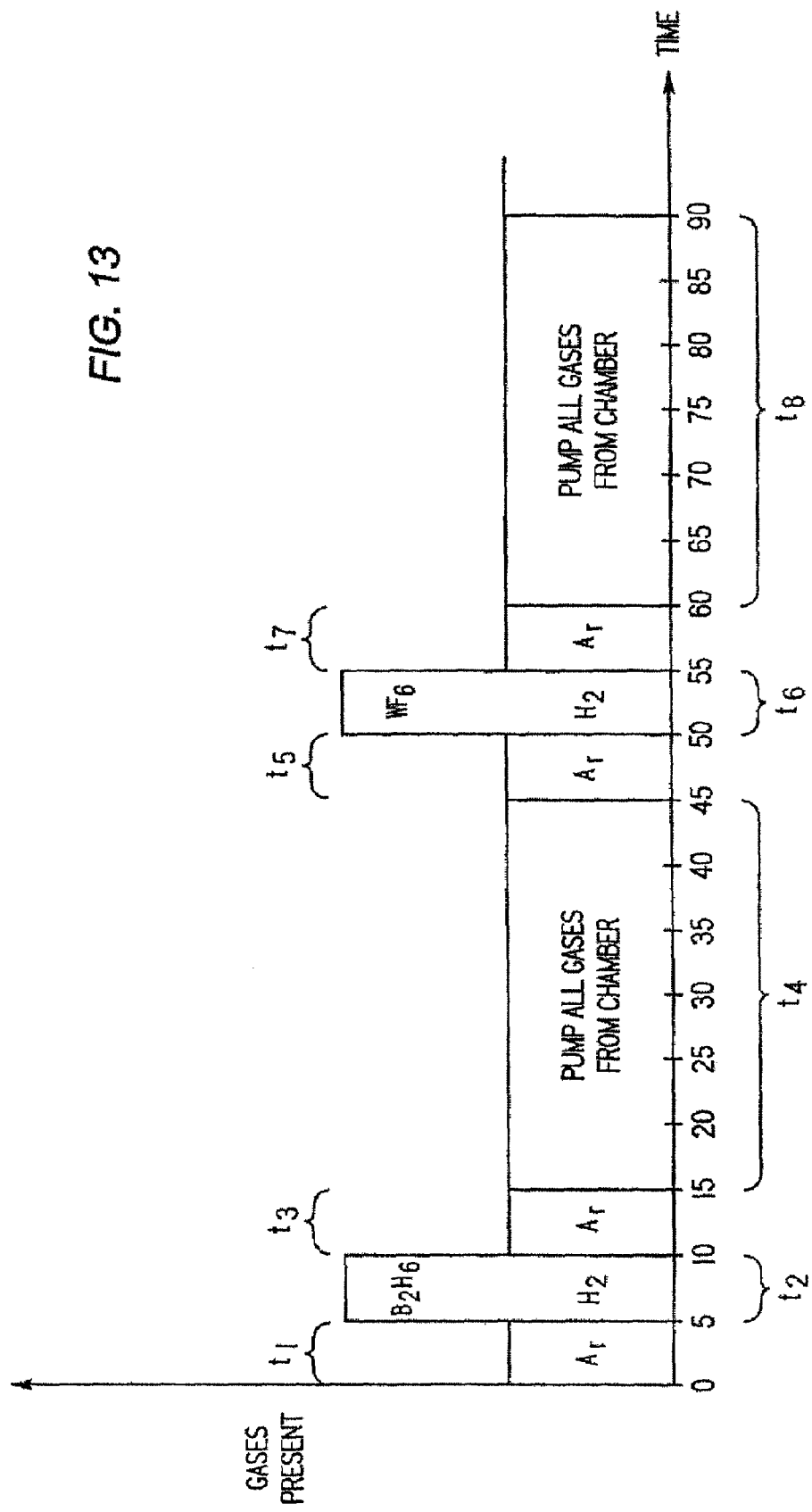
FIG. 13 is a graphical representation showing the concentration of gases shown above in FIG. 5 in accordance with a second alternate embodiment of the present invention.

As mentioned above, in an alternate embodiment of the present invention, the carrier gas may differ from the purge gas, as shown in FIG. 12. The purge gas, which is introduced at time intervals $t_1$, $t_3$, $t_5$ and $t_7$ comprises of Ar. The carrier gas, which is introduced at time intervals $t_2$ and $t_6$, comprises of $N_2$. Thus, at time interval $t_2$ the gases introduced into the processing chamber include a mixture of $B_2H_6$ and $N_2$, and a time interval $t_6$, the gas mixture includes $WF_6$ and $N_2$. The pump process during time intervals $t_4$ and $t_8$ is identical to the pump process discussed above with respect to FIG. 5. In yet another embodiment, shown in FIG. 13, the carrier gas during time intervals $t_2$ and $t_6$ comprises $H_2$, with the purge gas introduced at time intervals $t_1$, $t_3$, $t_5$ and $t_7$ comprising of Ar. The pump processes at time intervals $t_4$ and $t_8$ are as discussed above. As a result, at time interval $t_2$ the gas mixture introduced into the processing chamber 37 consists of $B_2H_6$ and $H_2$, and $WF_6$ and $H_2$, at time interval $t_6$.

Figure 14:
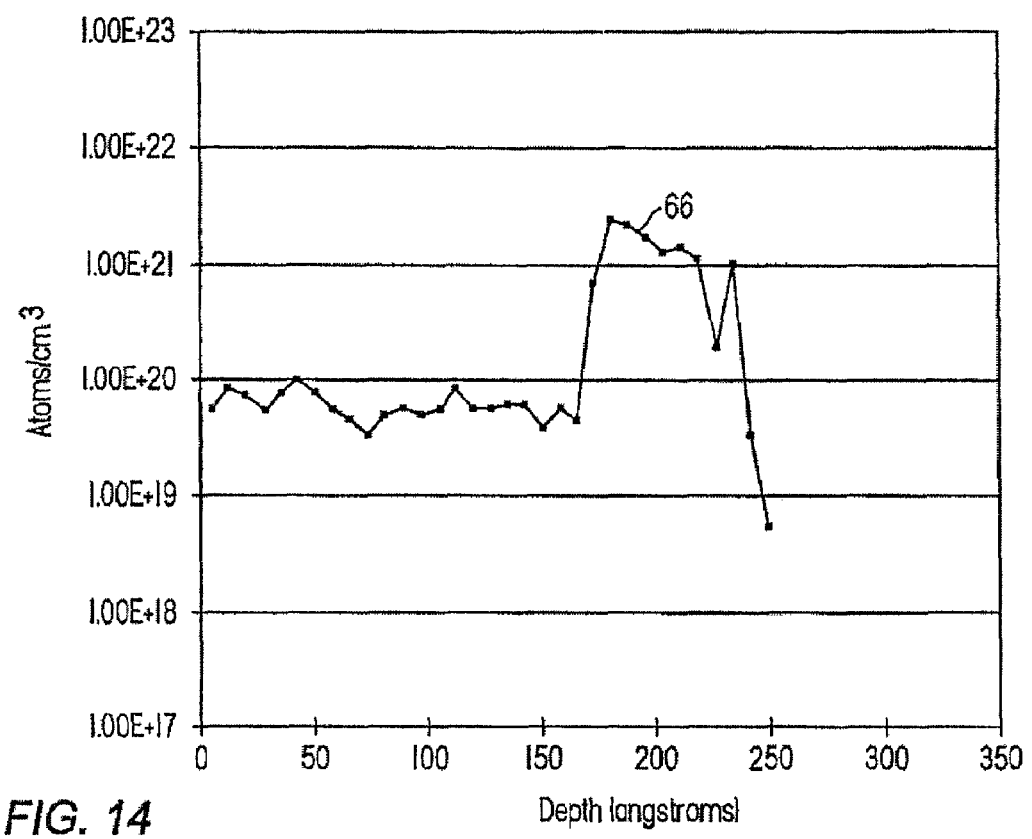
FIG. 14 is a graphical representation showing the fluorine content versus depth of a refractory metal layer formed on a substrate employing ALD either Ar or $N_2$ being a carrier gas.
Figure 15:
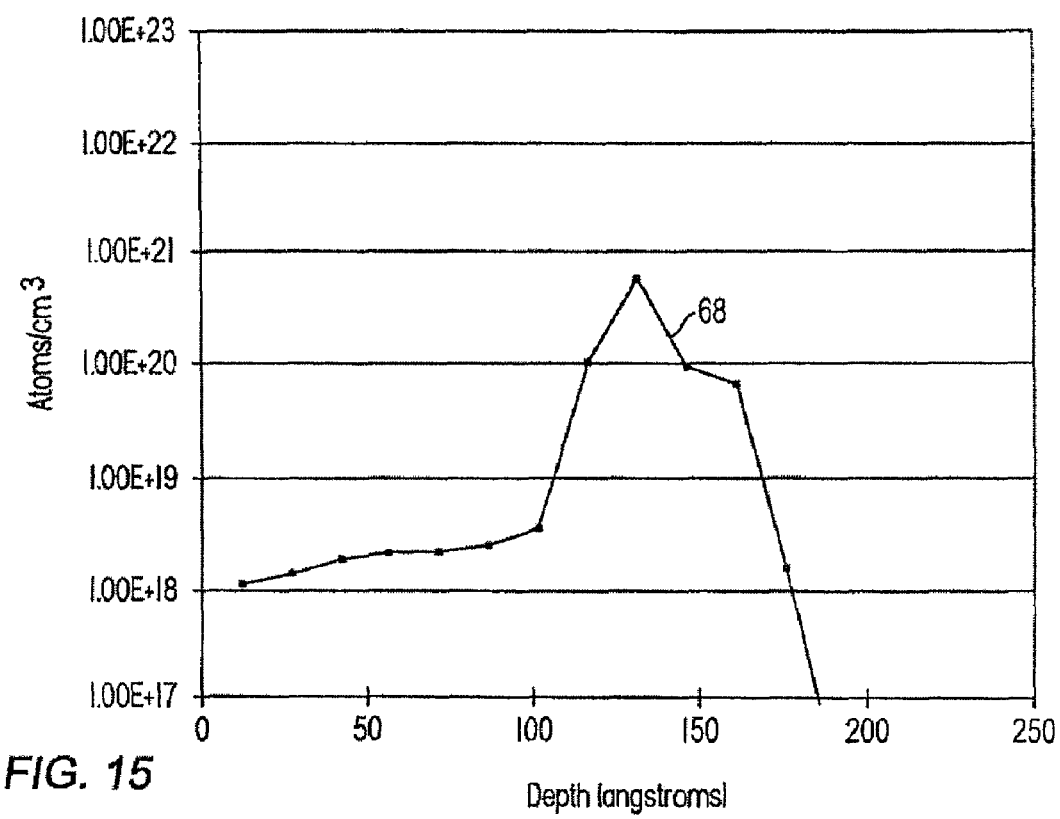
FIG. 15 is a graphical representation showing the fluorine content versus depth of a refractory metal layer formed on a substrate employing ALD with $H_2$ being a carrier gas.

An advantage realized by employing the $H_2$ carrier gas is that the stability of the tungsten layer A may be improved. Specifically, by comparing curve 66 in FIG. 14 with the curve 68 in FIG. 15, it is seen that the concentration of fluorine in the nucleation layer 60 is much less when $H_2$ is employed as the carrier gas, as compared with use of $N_2$ or Ar as a carrier gas. Specifically, the apex and nadir of curve 66 show that the fluorine concentration reaches levels in excess of $1 \times 10^{21}$ atoms per cubic centimeter and only as low as just below $1 \times 10^{19}$ atoms per cubic centimeter. Curve 68, however, shows that the fluorine concentration is well below $1 \times 10^{21}$ atoms per cubic centimeter at the apex and well below $1 \times 10^{17}$ atoms per cubic centimeter at the nadir. Thus, employing $H_2$ as the carrier gas provides a much more stable film, i.e., the probability of fluorine diffusing into the substrate, or adjacent layer is reduced. This also reduces the resistance of the refractory metal layer by avoiding the formation of a metal fluoride that may result from the increased fluorine concentration. Thus, the stability of the nucleation layer, as well as the resistivity of the same, may be controlled as a function of the carrier gas employed. This is also true when a refractory metal layer is deposited entirely employing ALD techniques, i.e., without using other deposition techniques, such as CVD.

Referring again to FIG. 2, the process for depositing the tungsten layer may be controlled using a computer program product that is executed by the controller 22. To that end, the controller 22 includes a central processing unit (CPU) 70, a volatile memory, such as a random access memory (RAM) 72 and permanent storage media, such as a floppy disk drive for use with a floppy diskette, or hard disk drive 74. The computer program code can be written in any conventional computer readable programming language; for example, 68000 assembly language, C, C++, Pascal, FORTRAN, and the like. Suitable program code is entered into a single file, or multiple files, using a conventional text editor and stored or embodied in a computer-readable medium, such as the hard disk drive 74. If the entered code text is in a high level language, the code is compiled and the resultant compiler code is then linked with an object code of precompiled WINDOWS® library routines. To execute the linked and compiled object code the system user invokes the object code, causing the CPU 70 to load the code in RAM 72. The CPU 70 then reads and executes the code to perform the tasks identified in the program.

Although the invention has been described in terms of specific embodiments, one skilled in the art will recognize that various changes to the reaction conditions, i.e., temperature, pressure, film thickness and the like can be substituted and are meant to be included herein. In addition, other refractory metals may be deposited, in addition to tungsten, and other deposition techniques may be employed in lieu of CVD. For example, physical vapor deposition (PVD) techniques, or a combination of both CVD and PVD techniques may be employed. Therefore, the scope of the invention should not be based upon the foregoing description. Rather, the scope of the invention should be determined based upon the claims recited herein, including the full scope of equivalents thereof.

What is claimed is:

1. A method for forming a tungsten material on a substrate surface, comprising:
   heating a substrate within a deposition chamber to a deposition temperature;
   exposing the substrate sequentially to diborane and a tungsten precursor gas to form a tungsten nucleation layer on the substrate during an atomic layer deposition process; and
   exposing the substrate to a deposition gas comprising hydrogen gas and the tungsten precursor gas to form a tungsten bulk layer over the tungsten nucleation layer during a chemical vapor deposition process.

2. The method of claim 1, further comprising exposing the substrate to an initiation gas prior to the atomic layer deposition process.

3. The method of claim 2, wherein the initiation gas comprises nitrogen or argon.

4. The method of claim 3, wherein the substrate is exposed to the initiation gas for about 5 seconds.

5. The method of claim 1, wherein the substrate is exposed to a reducing gas comprising the diborane and hydrogen gas during the atomic layer deposition process.

6. The method of claim 5, wherein the tungsten precursor gas comprises tungsten hexafluoride.

7. The method of claim 1, wherein the tungsten nucleation layer is formed having a thickness within a range from about 10 Å to about 100 Å.

8. The method of claim 1, wherein the deposition chamber is a single station within a deposition system.

9. The method of claim 1, wherein the deposition chamber is a first deposition station within a deposition system containing multiple stations surrounded by a wall.

10. The method of claim 9, further comprising:
    positioning the substrate into a second deposition station subsequent the atomic layer deposition process and prior to the chemical vapor deposition process; and
    forming the tungsten bulk layer within the second deposition station.

11. The method of claim 9, further comprising:
    positioning the substrate comprising the tungsten nucleation layer into a second deposition station within the deposition system; and
    forming the tungsten bulk layer over the tungsten nucleation layer by the chemical vapor deposition process within the second deposition station.

12. The method of claim 1, wherein the deposition chamber during the atomic layer deposition process has a pressure within a range from about 1 Torr to about 10 Torr.

13. The method of claim 12, wherein the deposition temperature is within a range from about 200° C. to about 400° C.

14. A method for forming a tungsten material on a substrate surface, comprising:
    exposing a substrate within a deposition chamber sequentially to a reducing gas and a tungsten precursor gas to form a tungsten nucleation layer on the substrate during an atomic layer deposition process; and
    exposing the substrate to a deposition gas comprising hydrogen gas and the tungsten precursor gas to form a tungsten bulk layer over the tungsten nucleation layer during a chemical vapor deposition process.

15. The method of claim 14, further comprising exposing the substrate to an initiation gas prior to the atomic layer deposition process.

16. The method of claim 15, wherein the initiation gas comprises nitrogen or argon.

17. The method of claim 16, wherein the substrate is exposed to the initiation gas for about 5 seconds.

18. The method of claim 15, wherein the reducing gas comprises a gas selected from the group consisting of diborane, hydrogen, silane, derivatives thereof, and combinations thereof.

19. The method of claim 14, wherein the reducing gas comprises diborane and hydrogen.

20. The method of claim 19, wherein the tungsten precursor gas comprises tungsten hexafluoride.

21. The method of claim 14, wherein the reducing gas comprises silane and hydrogen.

22. The method of claim 21, wherein the tungsten precursor gas comprises tungsten hexafluoride.

23. The method of claim 14, wherein the tungsten nucleation layer is formed having a thickness within a range from about 10 Å to about 100 Å.

24. The method of claim 14, wherein the deposition chamber is a single station within a deposition system.

25. The method of claim 14, wherein the deposition chamber is a first deposition station within a deposition system containing multiple stations surrounded by a wall.

26. The method of claim 25, further comprising:
positioning the substrate into a second deposition station subsequent the atomic layer deposition process and prior to the chemical vapor deposition process; and
forming the tungsten bulk layer within the second deposition station.

27. The method of claim 25, further comprising:
positioning the substrate comprising the tungsten nucleation layer into a second deposition station within the deposition system; and
forming the tungsten bulk layer over the tungsten nucleation layer by the chemical vapor deposition process within the second deposition station.

28. The method of claim 14, wherein the deposition chamber during the atomic layer deposition process has a pressure within a range from about 1 Torr to about 10 Torr.

29. The method of claim 28, wherein the substrate is heated to a deposition temperature within a range from about 200° C. to about 400° C. during the atomic layer deposition process.

30. A method for forming a tungsten material on a substrate surface, comprising:
positioning a substrate at a first deposition station within a deposition system comprising at least two deposition stations;
flowing a reducing gas into the first deposition station, whereby the reducing gas is adsorbed onto the substrate to form an adsorbed reducing gas layer;
purging the first deposition station;
exposing the substrate sequentially to a tungsten precursor gas and diborane to form a tungsten nucleation layer thereon during an atomic layer deposition process;
positioning the substrate at a second deposition station within the deposition system; and
exposing the substrate to the tungsten precursor gas and hydrogen gas to deposit a tungsten bulk layer over the tungsten nucleation layer by a chemical vapor deposition process.

31. The method of claim 30, further comprising exposing the substrate to an initiation gas prior to the atomic layer deposition process.

32. The method of claim 31, wherein the initiation gas comprises nitrogen or argon.

33. The method of claim 32, wherein the substrate is exposed to the initiation gas for about 5 seconds.

\* \* \* \* \*